(12) United States Patent
Robert et al.

(10) Patent No.: US 8,571,504 B2
(45) Date of Patent: Oct. 29, 2013

(54) RECEIVER

(75) Inventors: Sebastien Robert, Emieville (FR); Walter Jaudard, Caen (FR)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 13/433,618

(22) Filed: Mar. 29, 2012

(65) Prior Publication Data

US 2012/0249234 A1 Oct. 4, 2012

(30) Foreign Application Priority Data

Mar. 31, 2011 (EP) ...................................... 11290165

(51) Int. Cl.
*H04B 1/16* (2006.01)
(52) U.S. Cl.
USPC ........................ 455/200.1; 455/234.1; 455/254
(58) Field of Classification Search
USPC .......... 455/231.1, 234.1, 234.2, 239.1, 245.1, 455/249.1, 254, 307, 200.1; 330/85, 259, 330/293, 296
See application file for complete search history.

(56) References Cited

U.S. PATENT DOCUMENTS

| | | | |
|---|---|---|---|
| 2004/0251947 A1 | 12/2004 | Wang | |
| 2007/0040609 A1* | 2/2007 | Taylor | .............................. 330/85 |
| 2008/0012643 A1 | 1/2008 | Duperray | |
| 2008/0220735 A1 | 9/2008 | Kim et al. | |
| 2009/0079502 A1 | 3/2009 | Tanaka | |
| 2010/0148876 A1* | 6/2010 | Frohlich et al. | ................ 330/293 |

FOREIGN PATENT DOCUMENTS

JP         8-148944 A         6/1996

OTHER PUBLICATIONS

Advanced Television Systems Committee, Inc. (ATSC), "ATSC Recommended Practice: Receiver Performance Guidelines", Document A/74:2010, 88 pgs. (Apr. 2010).
Rako, P. "Silicon TV Tuners: The Game is On", EDN, pp. 24-30 (Sep. 23, 2010).
Vidojkovic, V. et al. "Fully-Integrated DECT/Bluetooth Multi-Band LNA in 0.18 µm CMOS", IEEE International Symp. on Circuits and Systems (ISCAS), vol. 1, pp. I-565-568 (May 2004).
Extended European Search Report for EP Patent Appln. No. 11290165.7 (Nov. 2, 2011).

* cited by examiner

*Primary Examiner* — Thanh Le

(57) ABSTRACT

A receiver (400; 500) comprising an amplifier (406; 506) having an input (408) and an output (410). The input (408) of the amplifier is configured to receive a signal. The receiver also comprises a feedback path (412; 512) between the output (410) and the input (408) of the amplifier (406; 506), wherein the feedback path (412; 512) includes a filter (402; 502) and a buffer amplifier (414; 514) in series. The input of the buffer amplifier (414; 514) is connected to the output (410; 510) of the amplifier (406; 506). The output of the buffer amplifier (414; 514) is connected to the input of the filter (402; 502). The output of the filter (402; 502) is connected to the input (408; 508) of the amplifier (406; 506). The filter (402; 502) is configured to pass signals having a desired frequency.

13 Claims, 20 Drawing Sheets

Voltage gain:  $G_v = \dfrac{V_{out}}{V_{in}}$

Composite voltage gain:  $G_{vc} = \dfrac{V_{out}}{E}$

LNA single input to single output

LNA single input to differential outputs

LNA differential inputs to differential outputs

LNA topology with the
selective filter in the feedback loop

RECEIVER

CROSS-REFERENCE TO RELATED APPLICATIONS

This application claims the priority under 35 U.S.C. §119 of European patent application no. 11290165.7, filed on Mar. 31, 2011, the contents of which are incorporated by reference herein.

The present disclosure relates to the field of receivers, and in particular, although not exclusively, receivers for televisions that are subjected to relatively strong interference signals.

In the A74 standard for television reception, the sensitivity of the receiver is specified in the presence of strong interference signals. For example a DTV receiver must be able to receive a channel of −68 dBm when an interference signal 57 dB higher is at a frequency that is 36 MHz from the wanted channel. The TV spectrum is from 40 MHz to 1 GHz.

Selectivity in front of the receiver is of great interest in order to satisfy specifications such as A74 because in this case the receiver is protected against strong interference signals. Indeed, if the wanted channel is weak and if strong interference signals are present close to the wanted channel, then the linearity of a receiver that processes both the wanted channel and the interference signals must be high to avoid SNR degradation. Now if a selective filter is placed in front of the receiver then the level of the interference signals is attenuated, and the linearity specification of the receiver is relaxed for the same SNR performance.

The listing or discussion of a prior-published document or any background in the specification should not necessarily be taken as an acknowledgement that the document or background is part of the state of the art or is common general knowledge.

According to a first aspect of the invention, there is provided a receiver comprising:

an amplifier having an input and an output, wherein the input of the amplifier is configured to receive a signal; and a feedback path between the output and the input of the amplifier, wherein the feedback path includes a filter and a buffer amplifier in series, wherein the input of the buffer amplifier is connected to the output of the amplifier, the output of the buffer amplifier is connected to the input of the filter, the output of the filter is connected to the input of the amplifier, and wherein the filter is configured to pass signals having a desired frequency.

The filter is input-referred and due to the Miller effect it performs as if it were connected directly to the input of the amplifier, thereby filtering out unwanted signals before they are processed by the amplifier. This can be considered as advantageous as the amplifier is not required to process strong unwanted signals across the full frequency spectrum, and therefore can provide better sensitivity for weak signals having the desired frequency. In addition, the filter does not have to be placed in series at the input of the amplifier and therefore can use components that have a lower quality than may be necessary in the prior art.

Use of the buffer amplifier can enable the gain of the amplifier to be independent from the impedance of the filter, as the buffer amplifier can adapt the impedance between the output of the amplifier and the filter.

The input of the amplifier may be configured to receive the signal either directly or indirectly from an antenna, and in some examples the input of the amplifier may be connectable either directly or indirectly to an antenna.

The amplifier may be a low noise amplifier.

It will be appreciated that any of the connections disclosed herein may be direct or indirect connections. For example, two components may be indirectly connected via intermediary components whilst still providing embodiments of the invention.

The buffer amplifier may be a class AB amplifier, and may be a unity gain amplifier.

Any one or more of the filters disclosed herein may or may not be a tuneable filter.

The filter may be a band pass filter, and this may be a convenient component for enabling the signals with the desired frequency to pass and filtering out any interference signals.

The amplifier may be a variable gain amplifier. In this way, operational parameters of the receiver can be adjusted in order to improve the performance of the receiver.

The receiver may further comprise a detector configured to detect the output of the amplifier. The detector may control the gain of the variable gain amplifier in accordance with the output of the amplifier in order to avoid distortion of the output. In this way, the amplifier can be operated with a large gain value, but without degrading the quality of the output signal.

The receiver may further comprise a controller configured to adjust the gain of the variable gain amplifier in order to change the input impedance of the receiver. The controller may be configured to adjust the input impedance such that it is brought into conformity with the impedance of the antenna to which the receiver is connected in use. Improving the impedance matching of the receiver can improve the performance of the receiver.

The feedback path may include a variable resistor. The receiver may also include a controller configured to adjust the value of the variable resistor in order to change the input impedance of the receiver such that it is brought into conformity with the impedance of the antenna to which the receiver is connected in use. This is an alternative way of improving the impedance matching of the receiver, and hence improving the performance of the receiver.

The receiver may comprise a plurality of feedback paths in parallel between the output and the input of the amplifier. One or more of the feedback paths may be configured to be included or excluded from the receiver in accordance with the frequency of the desired signals. In this way, a feedback path that provides improved performance at specific frequencies when compared with the other feedback paths can be used, thereby improving the performance of the receiver.

One or more of the plurality of feedback paths may comprise a switch that is operable to include or exclude the feedback path. The switch may be a MOS switch, a controllable buffer or any other suitable switch.

One or more of the feedback paths may comprise a controllable buffer. The gain of the controllable buffers may be configured to be set to zero in order to exclude the components in the associated feedback path. The gain of the controllable buffers may be configured to be set to one in order to provide a unity gain buffer and include the components in the associated feedback path. The gain of the controllable buffers may be configured to be set to any non-zero value in order to include the components in the associated feedback path.

The plurality of feedback paths may comprise filters that are configured to pass signals of different frequencies. In this way, one or more filters may be used in order to provide improved performance for signals with certain desired frequencies.

The receiver may further comprise a first, second and third feedback path in parallel with each other. The first feedback path may comprise a buffer amplifier and a variable capacitor. The second feedback path may comprise a controllable buffer and a first inductor. The third feedback path may comprise a controllable buffer and a second inductor. The two controllable buffers may be operable in accordance with the frequency of the desired signals. In this way, an acceptable quality factor can be maintained for different desired frequencies by utilising different component values in the feedback path of the amplifier. It will be appreciated that there they may be more than three parallel feedback paths so that different components such as capacitors, inductors and resistors, having different values, can be selectively included or excluded in the feedback path.

The receiver may further comprise a variable resistive attenuator connected to the input of the amplifier and a detector, wherein the detector is configured to sense the output signal of the amplifier and adjust the value of the resistive attenuator so that the output signal is not significantly distorted, and this may include preventing the amplitude of the output signal from exceeding a take over point (TOP). The value of the resistive attenuator may be adjusted such that the amplitude of the output signal is substantially similar to the take over point in order to protect the amplifier against clipping.

The term substantially similar may mean that two values differ by less than 0.001%, 0.01%, 0.1%, 0.2%, 0.5%, 1%, 2%, 5%, 10%, or 20%, for example.

The input of the amplifier may be connected to the input of a low noise amplifier. The amplifier may be a "single input to single output" LNA. The amplifier may be a "single input to differential outputs" LNA. The amplifier may be a "differential inputs to differential outputs" LNA.

There may be provided an integrated circuit comprising any receiver or circuit disclosed herein.

There may be provided a television set including any receiver, circuit or integrated circuit disclosed herein.

There may be provided a computer program, which when run on a computer, causes the computer to configure any apparatus, including a receiver, controller, integrated circuit, television set, or device disclosed herein. The computer program may be a software implementation, and the computer may be considered as any appropriate hardware, including a digital signal processor, a microcontroller, and an implementation in read only memory (ROM), erasable programmable read only memory (EPROM) or electronically erasable programmable read only memory (EEPROM), as non-limiting examples. The software may be an assembly program.

The computer program may be provided on a computer readable medium such as a disc or a memory device, or may be embodied as a transient signal. Such a transient signal may be a network download, including an internet download.

A description is now given, by way of example only, with reference to the accompanying drawings, in which.

Figure 31:
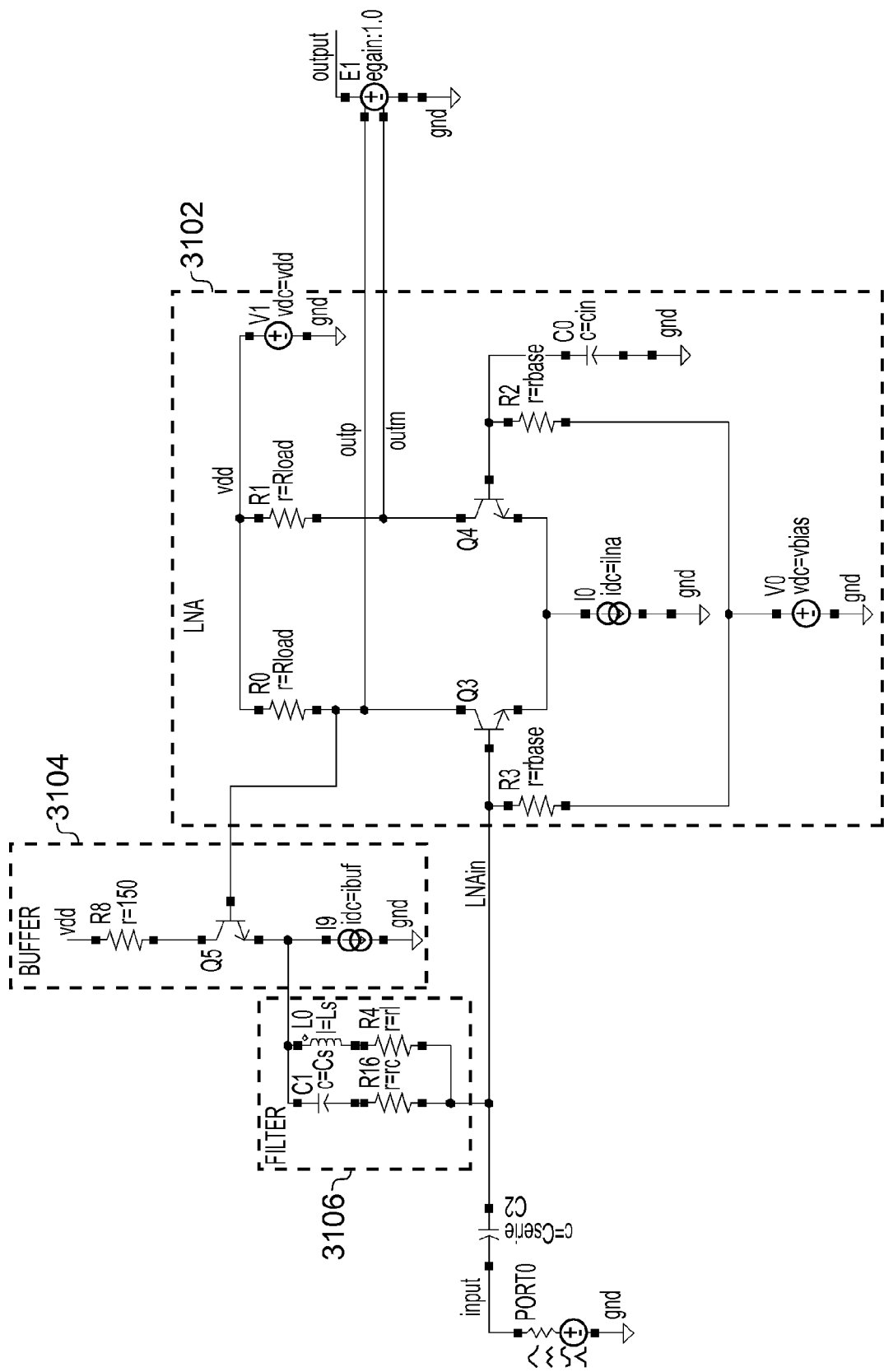
Figure 32A:
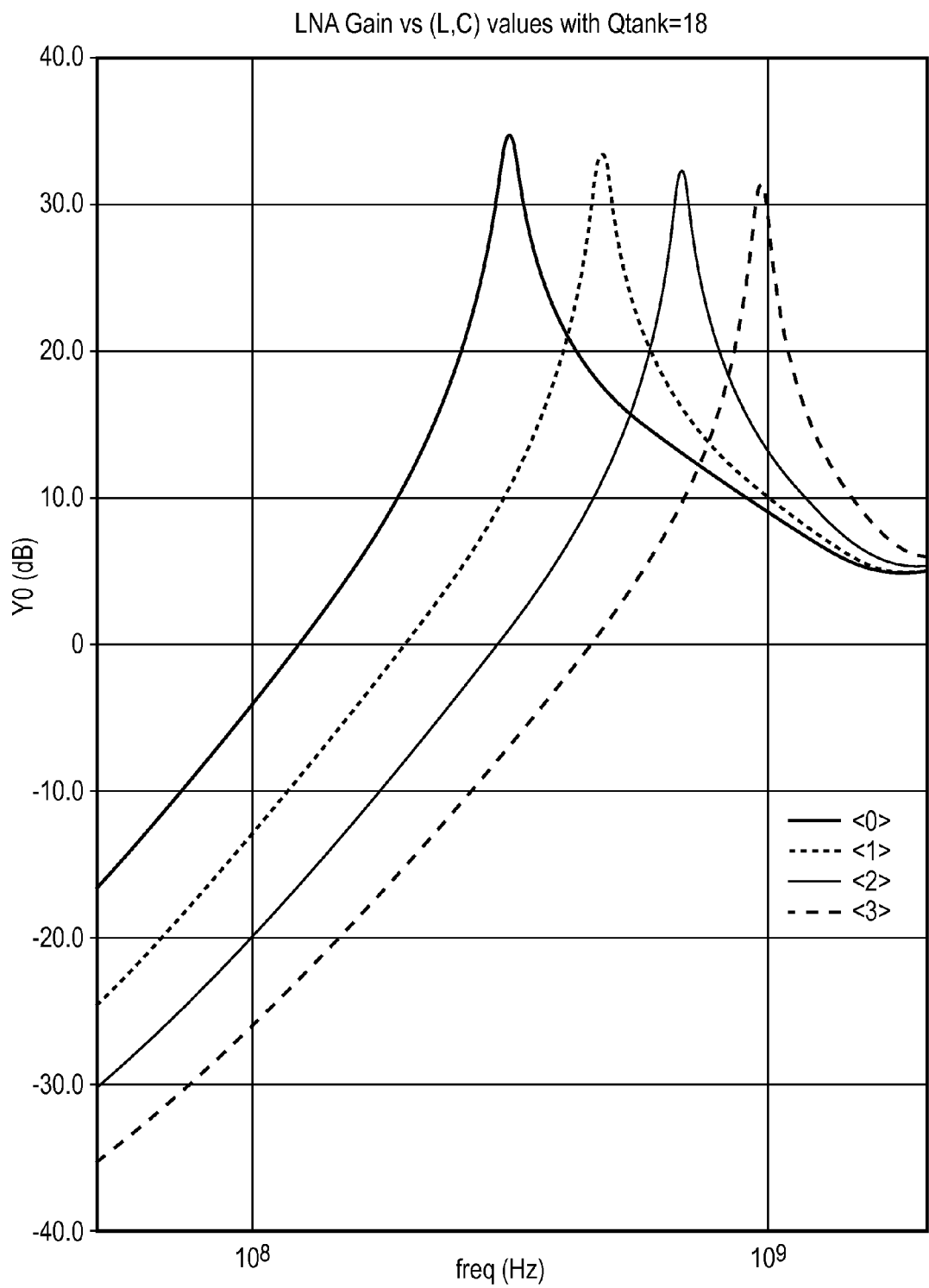
Figure 32B:
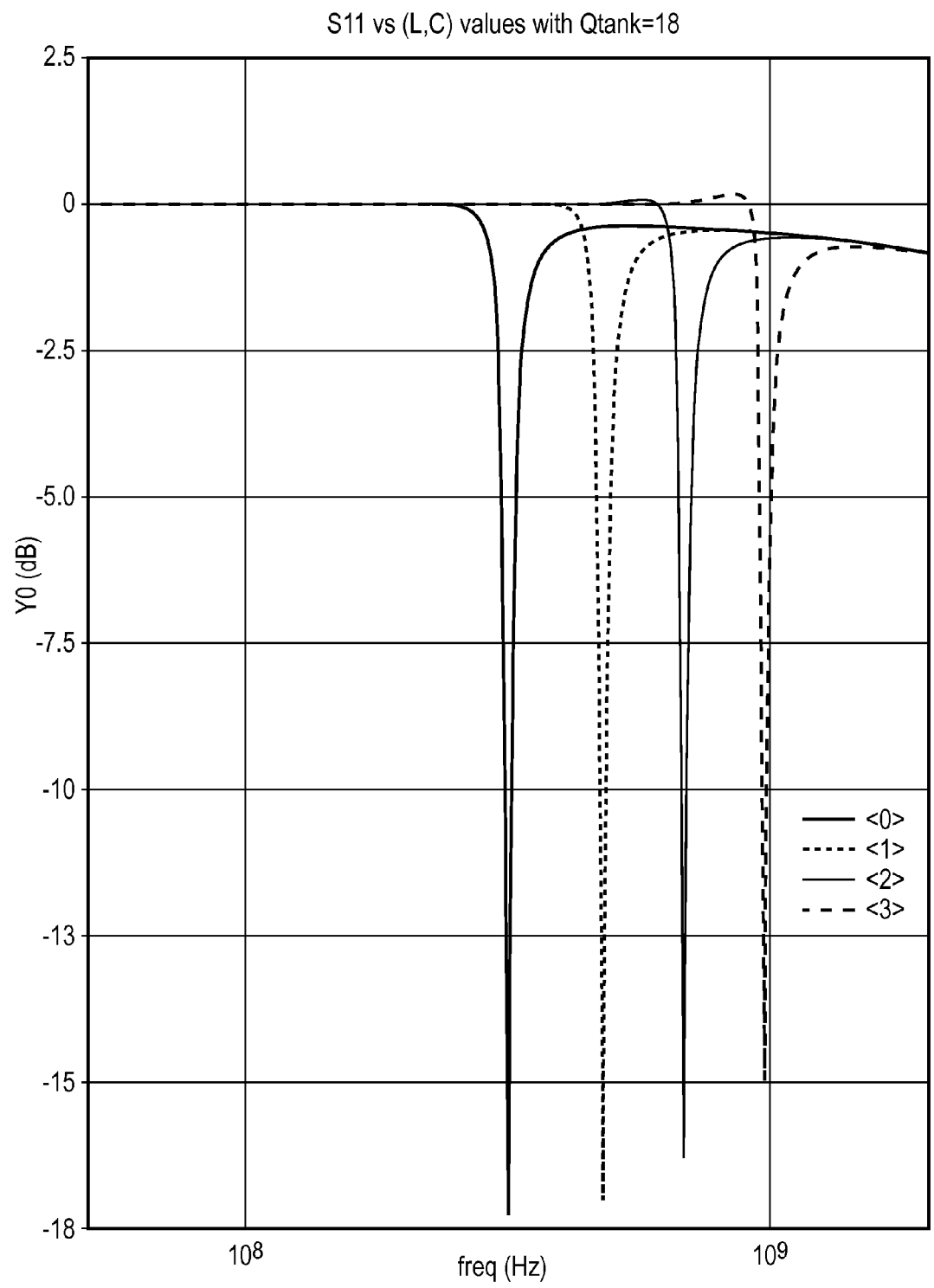
Figure 33:
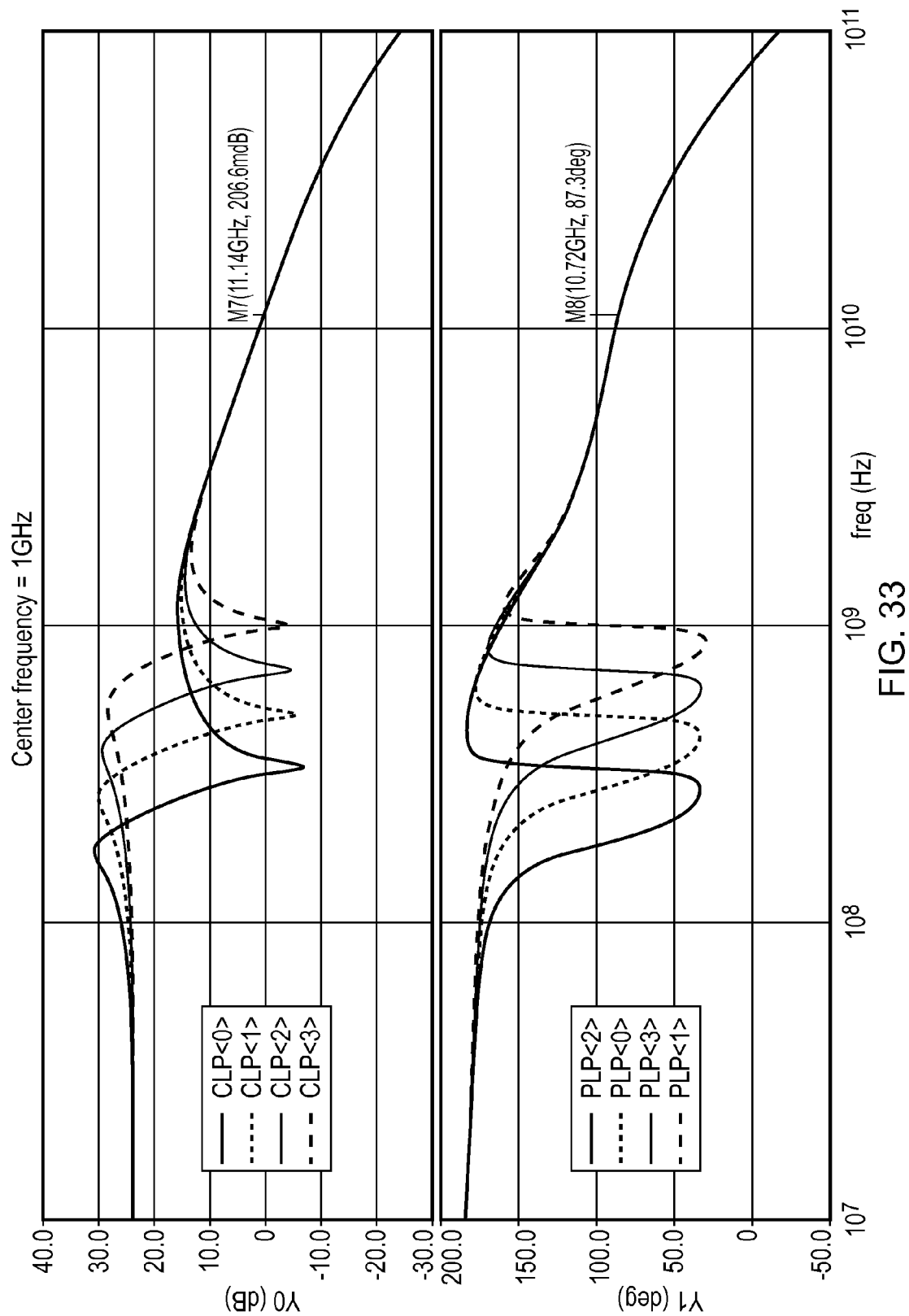

FIGS. 30*a* to 30*d* illustrate schematically receivers according to embodiments of the invention;

FIG. 31 illustrates a receiver according to an embodiment of the invention;

FIGS. 32A and B illustrates graphically the performance of a receiver according to an embodiment of the invention; and FIG. 33 illustrates graphically the performance of a receiver according to an embodiment of the invention.

One or more embodiments described herein relate to an amplifier for receiving an input signal, which in one example is from an antenna. The receiver has a feedback path between the input and the output of the amplifier, wherein a tuneable filter is provided in series with a buffer in the feedback path. The tuneable filter is tuneable so as to pass signals of a desired frequency. Due to the Miller effect, the tuneable filter is input-referred and acts as if it were connected directly to the input of the amplifier, thereby filtering out unwanted signals before they are processed by the amplifier.

In this way, the tuneable filter does not have to be placed in series at the input of the amplifier, nor is the amplifier required to process signals across the full frequency spectrum. As described in more detail below, this can provide advantages over the prior art.

Two main types of TV tuners are known: CAN tuners and silicon tuners.

Figure 1:
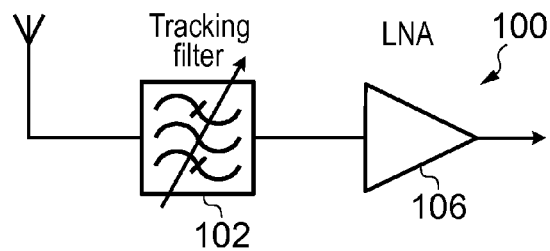
FIG. 1 shows a prior art CAN tuner.

FIG. 1 shows a classical CAN tuner 100 (so-called because they are housed in metal enclosures to minimize RF interference and crosstalk). The tuner 100 of FIG. 1 has a tuneable filter 102 placed between an antenna 104 and a low noise amplifier (LNA) 106. The tuneable filter 102 requires very high quality factor lumped inductor and capacitor components in order to operate correctly and is expensive because it is made of air-wound coils aligned by hand. In addition, the filter 102 is costly to adapt to various regions and standards.

Known CAN tuners are being replaced by silicon tuners. In silicon tuners the antenna filter 102 arrangement of FIG. 1 is not feasible because the integrated components that are used in the silicon tuner do not have a sufficiently high quality factor. Even with capacitor banks, the quality factor is deteriorated and the tuner noise figure (NF) is higher than 5 dB. This degrades the overall performance of the receiver as silicon tuners typically have an NF that is inferior to 4 dB.

Figure 2:
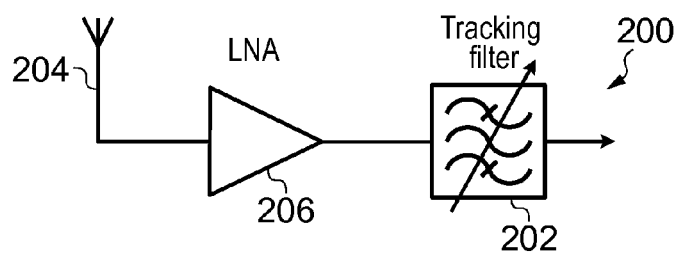
FIG. 2 shows part of a prior art silicon tuner.

FIG. 2 shows part of the silicon tuner 200 of the NXP integrated circuit TDA18273. Any problems in relation to a reduced quality factor with silicon tuners are often overcome by connecting the selective filter 202 just after the LNA 206 as shown in FIG. 2.

The noise figure of the silicon tuner of FIG. 2 is fixed by the noise figure of the LNA 206, as opposed to the noise figure of the selective filter 202. The disadvantage of this solution is that the LNA 206 is connected to the antenna 204, and therefore must handle the whole input spectrum. Thus the linearity of the LNA 206 must be very high in case of a weak wanted channel with strong adjacent channels as long term evolution (LTE). Otherwise it will not be possible to properly process the received wanted signal.

Figure 3:
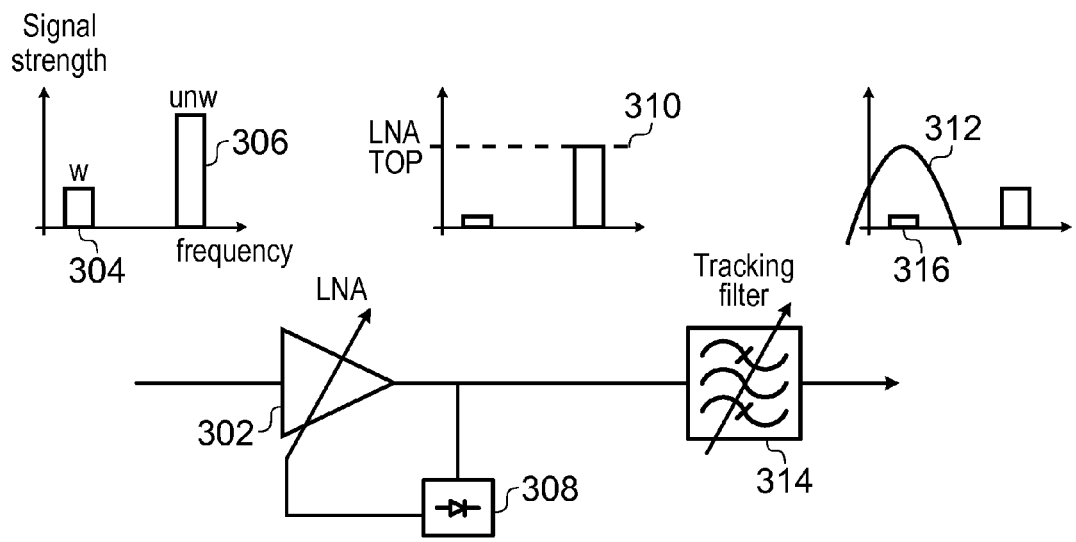
FIG. 3 illustrates schematically the performance of prior art silicon tuners.

FIG. 3 illustrates schematically operation of existing silicon tuners. In known silicon tuners, the NF is increased in the presence of interference signals because the gain of the LNA 302 is decreased to avoid saturation of the interference signals at the LNA output. The wanted signals (w) are shown with reference 304 in FIG. 3 and the unwanted interference signals (unw) are shown with reference 306. It can be seen in FIG. 3 that the unwanted signals 306 are a lot stronger than the wanted signals 304.

With known submicron technologies the supply voltage can be reduced to only a few volts (1.2V in CMOS 65 nm), and with such a low supply voltage the maximum achievable linearity is also small. In particular, the maximum output voltage swing can be limited and cannot be higher than the supply voltage. To avoid clipping of the LNA 302 output signal, a detector 308 can sense the LNA 302 output signal and then adjust the gain of the LNA 302 so that the output signal is kept below a pre-defined amplitude. This is illustrated schematically in FIG. 3 as the LNA Take Over Point or LNA TOP 310. In this case the LNA 302 is protected against clipping at its output, but the NF is high even if the interference signal 306 is far away (in terms of frequency) from the wanted channel 304. This, in turn, only allows the filter 314 to pass a weak wanted signal as the strength of the wanted signal has been kept low due to the low gain value of the amplifier 302 that is necessary to prevent LNA TOP 310 from being exceeded. The frequency response of the filter 314 is shown with reference 312 in FIG. 3, and the filtered signals at the output of the receiver are shown schematically with reference 316 in FIG. 3.

Embodiments of the present invention can provide a solution that integrates a tracking filter in front of a receiver/amplifier without significant signal to noise (SNR) degradation of the receiver.

Figure 4:
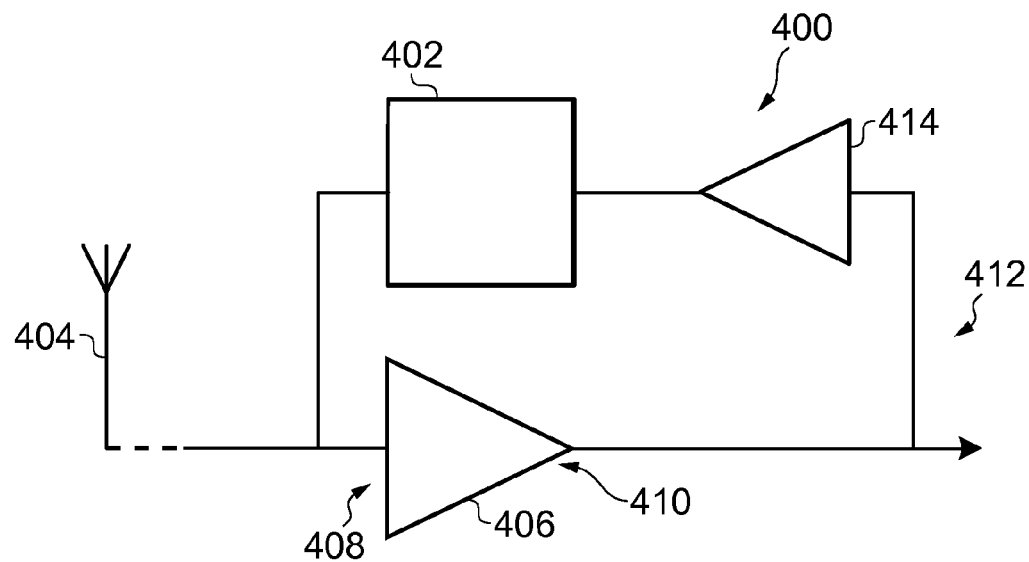
FIG. 4 shows a receiver according to an embodiment of the invention.

FIG. 4 shows a receiver 400 according to an embodiment of the invention. The receiver 400 has an amplifier 406 having an input 408 and an output 410. The amplifier 406 may or may not be the low noise amplifier (LNA) of the receiver as will be appreciated from the description of the embodiments of the invention that follows, particularly the embodiments that are illustrated as FIGS. 30a to 30d.

The input 408 of the amplifier 406 receives a signal, which in this example is from an antenna 404. In other examples, the amplifier 406 can receive a signal from another amplifier, such as a low noise amplifier (LNA), any component in a receive chain, or any component that can provide a signal that is suitable for processing by the receiver 400. A feedback path 412 is provided between the output 410 and the input 408 of the amplifier 406, and includes a buffer 414 and a filter 402 in series. The input of the buffer 414 is connected to the output 410 of the amplifier 406, and the output of the buffer 406 is connected to an input of the filter 402. The output of the filter 402 is connected to the input 408 of the amplifier 406.

The filter 402 can pass signals having a desired frequency. Typically, the filter 402 is a band-pass filter wherein the desired signals relate to the pass-band of the filter 402 and correspond to a channel that a user wishes to receive.

The buffer 414 provides for impedance adaptation between the output 410 of the amplifier 406 and the filter 402. In this way the gain of the amplifier 410 can be made independent from the impedance of the filter 402. As the buffer 414 has the filter 402 as its load, the buffer 414 can absorb the power of the interference signals so that it is not passed on to the filter 402. In this way, the power in the amplifier 406 can fix the noise figure of the receiver.

In the configuration of FIG. 4, the filter 402 acts as if it was connected directly to the antenna 404 due to the Miller effect. Also due to the Miller effect, the quality factor of the amplifier 406 is hardly impacted by the direct connection to the low impedance antenna (which may be 75 ohms in television systems). This embodiment of the invention can filter out interference signals before they are processed by the amplifier 406, thereby enabling the amplifier 406 to maintain a required sensitivity to properly process a desired signal that is weaker than any interference signals.

Figure 5:
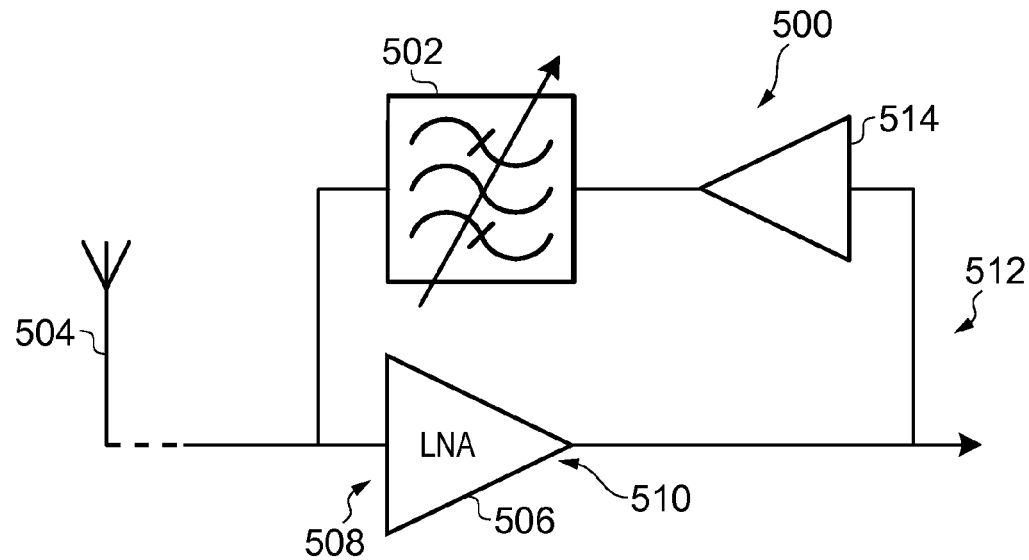
FIG. 5 shows a receiver according to another embodiment of the invention.

FIG. 5 illustrates a receiver 500 according to another embodiment of the invention. In this embodiment the amplifier 506 is a low noise amplifier (LNA) and the filter is a tuneable filter 502. The receiver 500 includes a buffer amplifier 514 in the feedback path 512 between the output 510 of the LNA 506 and the tuneable filter 502. The buffer amplifier 514 and tuneable filter 502 are provided in series in the feedback path 512 between the output 510 and the input 508 of the LNA 506.

The tuneable filter 502 is a high quality factor selective filter that is associated with the LNA 506 of the receiver 500 to form an active tracking filter with high quality factor. Also, as this tuneable filter 502 is associated with the LNA 506, the overall noise figure is kept low (for example, less than 4 dB). The centre frequency of the tracking filter 502 is programmable to be at the same frequency as the wanted channel, and can be programmable over a wideband spectrum.

Figure 6:
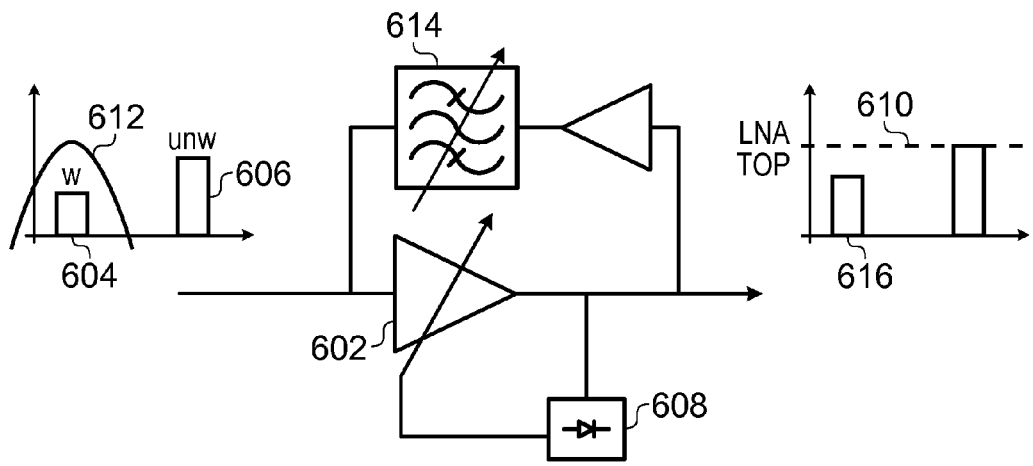
FIG. 6 illustrates schematically the performance of a receiver according to an embodiment of the invention.

FIG. 6 illustrates schematically the performance of a receiver according to an embodiment of the invention in a way that is similar to the performance of a prior art receiver shown as FIG. 3. The receivers of FIGS. 3 and 6 are shown with the same LNA TOP levels 310; 610.

As shown in FIG. 6, the gain of the LNA 602 can be kept at a higher value than is possible with FIG. 3 because the filtering is effectively performed at the input to the LNA 602. It can be seen that the amplitude of the wanted signals 616 in FIG. 6 is greater than the amplitude of the wanted signals "w" 316 in FIG. 3. Therefore, the gain-reducing effect on the amplifier 602 caused by the unwanted signals 606 is diminished. The filtering is shown schematically with reference 612 in FIG. 6. The NF can also be kept low, especially if the unwanted interference signals 606 are far away from the wanted channel 604.

Thus embodiments of the present invention can achieve acceptable sensitivity if the interference signal 606 is far enough away (in terms of frequency) from the wanted channel 604 such that it is filtered out before being applied to the input to the amplifier 602. This means that the impact on the sensitivity of the receiver by the presence of this interference signal is reduced when compared with the prior art.

Figure 7:
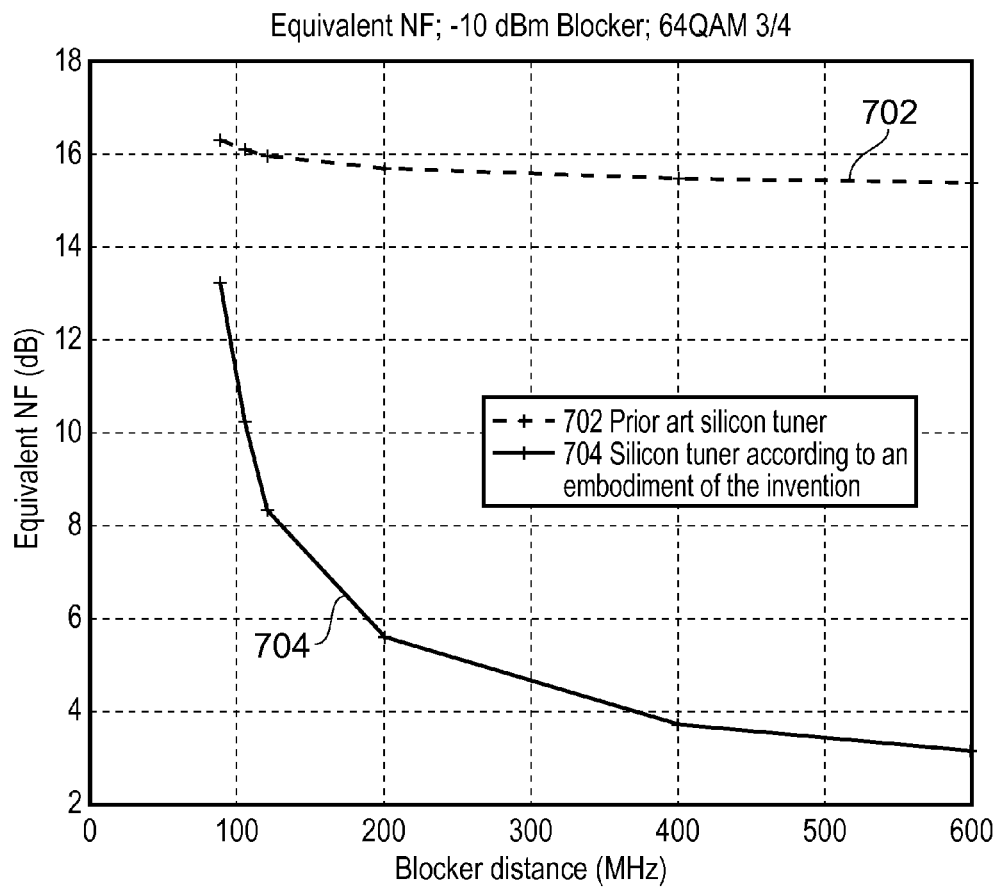
FIG. 7 illustrates graphically a comparison between the performance of a prior art silicon tuner and a receiver according to an embodiment of the invention.

FIG. 7 shows graphically the effect of a −10 dBm blocker/interference signal as the distance in frequency from the wanted signal is varied. Line 702 shows the performance of a prior art tuner and line 704 shows the performance of a tuner/receiver according to an embodiment of the invention. It can be seen that the equivalent NF in decibels of the embodiment of the invention reduces significantly as the distance between the interference signal and wanted signal is increased. The term "equivalent NF" on the vertical axis of the graph of FIG. 7 indicates that both noise and distortion are considered.

Composite Voltage Gain

Figure 8:
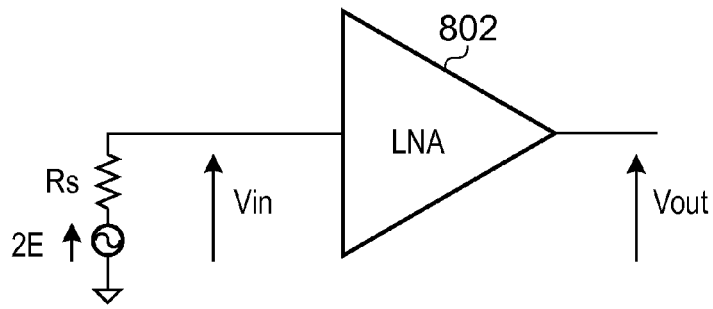
FIG. 8 illustrates schematically a definition of gains for a low noise amplifier.

FIG. 8 illustrates schematically an LNA 802 in order to discuss the "composite voltage gain" of the LNA 802. The composite voltage gain (Gvc) is a term that is well known in the art of radio frequency (RF) signal processing and is given, generically, as:

$$Gvc = \frac{V_{out}}{E}$$

Where 2E plus the voltage dropped across resistor Rs is equal to the input voltage, $V_{in}$, of the LNA 802. The corresponding output voltage is $V_{out}$.

The composite voltage gain of the LNA 802 is:

$$Gvc\_selective\_LNA = 2Gv \frac{Zfilter}{Zfilter + (1 + Gv)Rs}$$

Where:
Zfilter is the impedance of the tuneable filter in the feedback path (not shown in FIG. 8). The tuneable filter may be an LC tank circuit, and
Gv is the voltage gain of the LNA.

Figure 9:
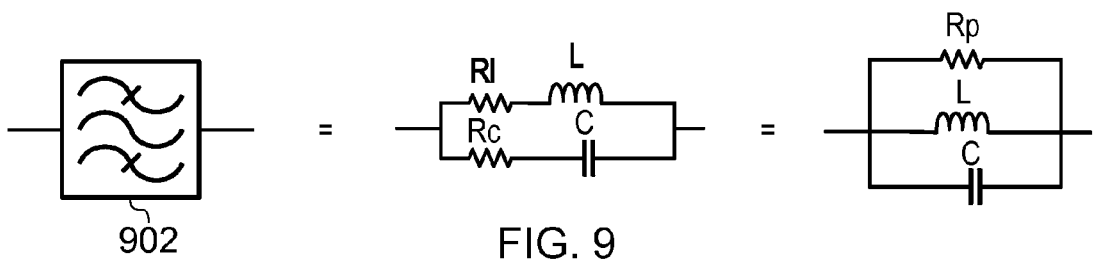
FIG. 9 shows the equivalent circuit of a tuneable filter that can be used with an embodiment of the invention.

FIG. 9 shows the equivalent circuit of a tuneable filter 902 that can be used with an embodiment of the invention. The equivalent circuit is an LC tank circuit.

The impedance of the tank circuit is:

$$Zfilter = \frac{jL\omega}{1 + \frac{L}{Rp}j\omega - LC\omega^2}$$

At the resonant frequency the impedance of the tank circuit is Rp. Thus at the resonant frequency of the tank circuit, the composite voltage gain of the present invention is:

$$Gvc\_selective\_LNA\_resonnance = 2Gv \frac{Rp}{Rp + (1 + Gv)Rs}$$

At the resonant frequency the composite voltage gain of the selective LNA is equal to the voltage gain of the LNA if the input matching is perfect.

Input Impedance

The input impedance of the LNA of an embodiment of the invention due to the Miller effect is:

$$Zin = \frac{Zfilter}{1 + Gv}$$

At the resonant frequency, we have:

$$Zin\_resonnance = \frac{Rp}{1 + Gv}$$

Figure 10:
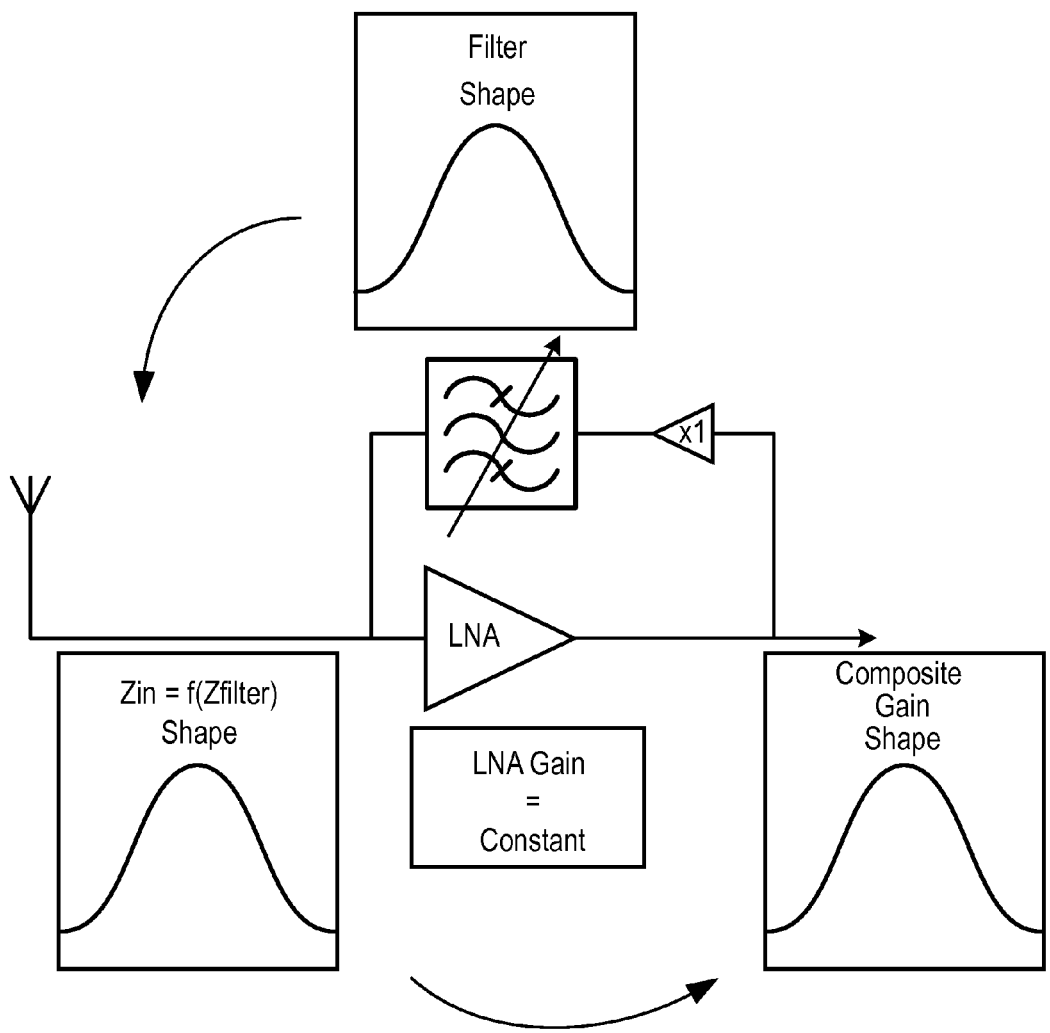
FIG. 10 illustrates schematically the performance of a receiver according to an embodiment of the invention.

Providing impedance matching at the wanted frequency, which is the resonant frequency of the tank circuit, can give particularly good performance. In order to have Zin_resonnance close to Rs, then Rp or Gv can be tuned (as described below). Outside the bandwidth of interest, Zin can be unmatched as shown in FIG. 10, which illustrates the input matching can be narrowband.

Matching Network

Figure 11:
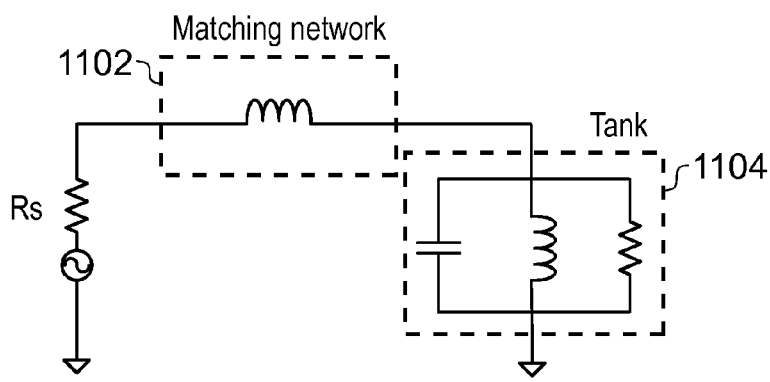
FIG. 11 illustrates a matching network in a CAN tuner.
Figure 12:
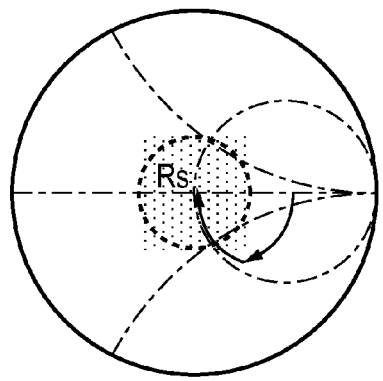
FIG. 12 shows in-band input matching in a CAN tuner.

In CAN tuners the selective filter 1104 can be made of an LC tank circuit, and a matching network is required to adapt the impedance between the source (Rs) and the tank circuit. This matching network is often a basic inductance 1102 as shown in FIG. 11, the performance of which is shown in FIG. 12 as a Smith chart. FIG. 12 shows in-band input matching in a CAN tuner.

Figure 13:
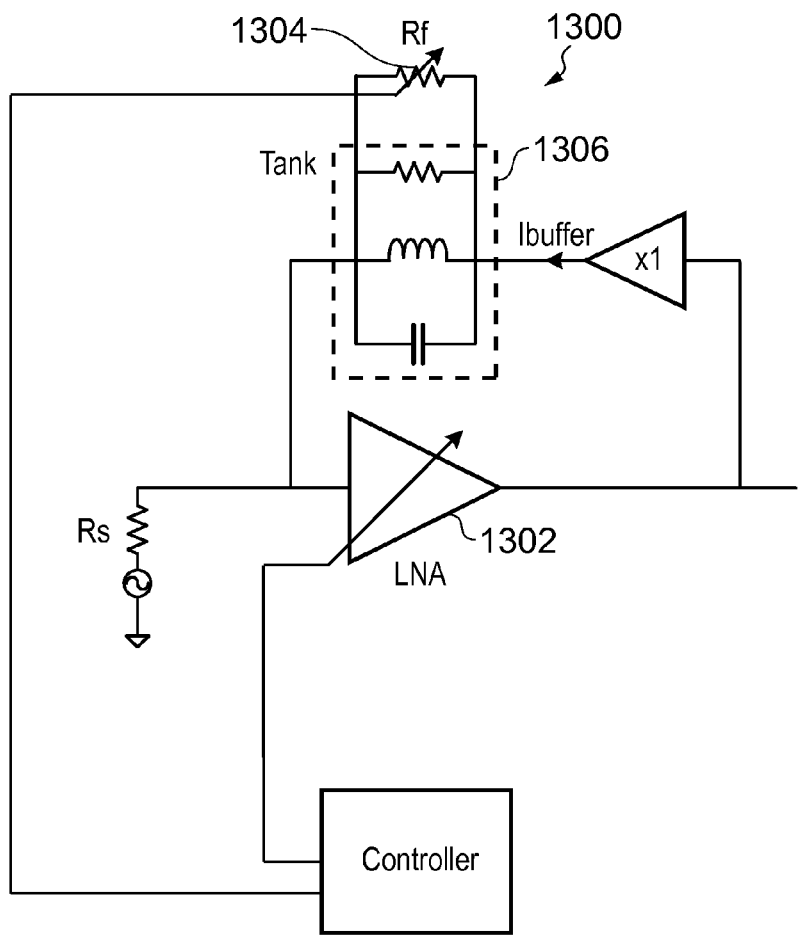
FIG. 13 illustrates a receiver according to an embodiment of the invention.
Figure 14:
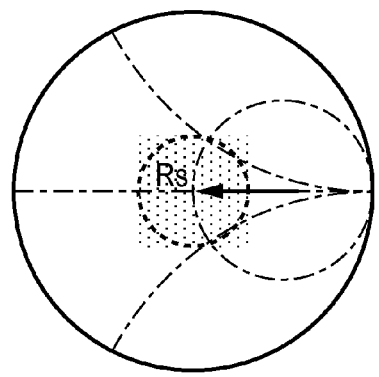
FIG. 14 illustrates schematically the performance of a receiver according to an embodiment of the invention.

Embodiments of the present invention may not require a matching network with the LNA as will be described with reference to the schematic diagram of FIG. 13. FIG. 13 illustrates a receiver 1300 according to an embodiment of the invention. The required input matching can be performed by: (i) adjusting the gain (Gv) of the LNA 1302; and/or (ii) adjusting a variable resistance Rf 1304 that is in parallel with the tank circuit 1306. It will be appreciated from the above equations that the input impedance of the receiver 1300 at the resonant frequency is affected by the values of Gv and Rf. Such functionality is shown in the Smith chart of FIG. 14.

The embodiment of FIG. 13 illustrates a controller 1308 that is used to adjust the gain (Gv) of the LNA 1302 and/or adjust the variable resistance Rf 1304. The controller 1308 may have access to a look up table (LUT) or database to determine which values should be applied for the gain (Gv) and/or variable resistance Rf in accordance with the frequency to which the receiver is tuned.

Quality Factor

As shown in FIG. 11, a matching network is necessary in CAN tuners to adapt the impedance between the source and the tank circuit. This is necessary for the input matching and also to provide a good quality factor of the selective filter.

Indeed, if the tank circuit is directly connected to Rs, then the quality factor would be:

$$\frac{RsRp}{Rs+Rp}\sqrt{\frac{C}{L}},$$

which leads to a low quality factor with typical LC values.

In contrast, the selective filter used in embodiments of the invention can be directly connected to the source with a limited degradation of the quality factor of the tank. Indeed the quality factor of the receiver 500 according to the embodiment of the invention of FIG. 5 is:

$$Q\_selective\_LNA = \frac{RsRp}{Rs+\frac{Rp}{(1+Gv)}}\sqrt{\frac{C}{L}}$$

Thus, if perfect input matching is achieved then the quality factor of the selective LNA is:

$$Q\_selective\_LNA\_matched = \frac{Rp}{2}\sqrt{\frac{C}{L}}$$

Figure 15:
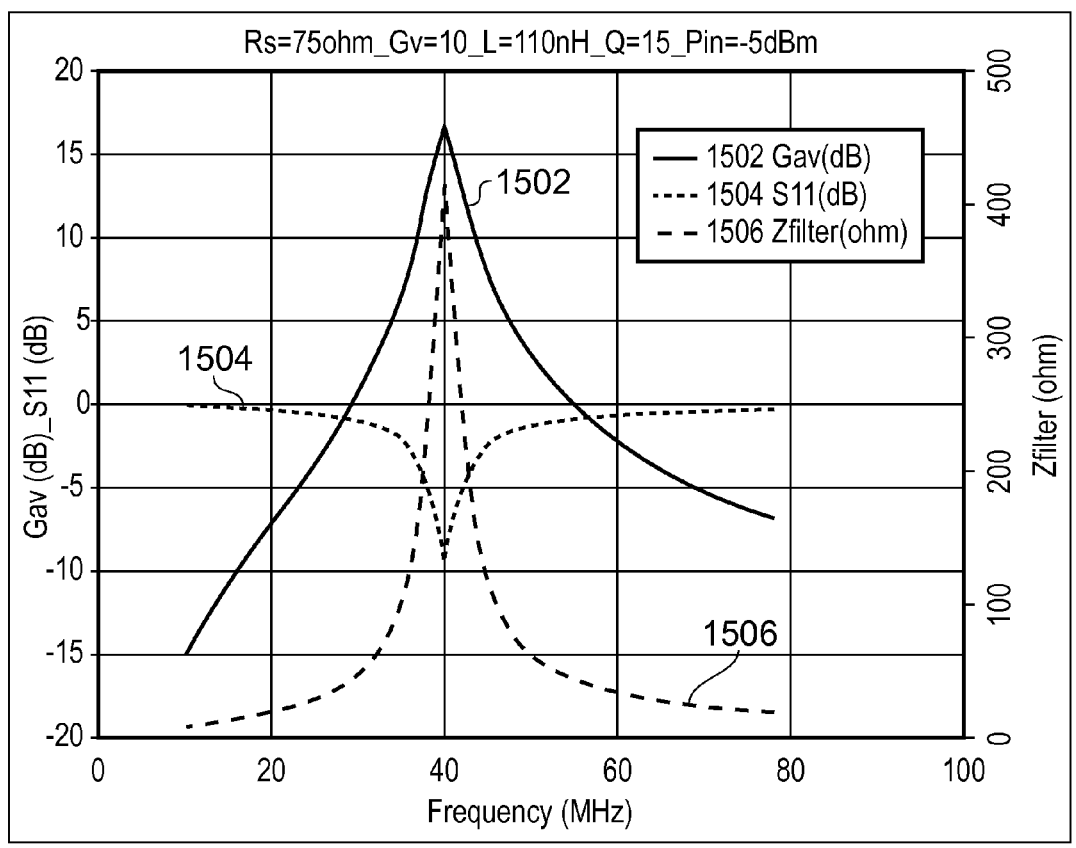
FIG. 15 illustrates graphically the performance of a receiver according to an embodiment of the invention.

FIG. 15 illustrates graphically the performance of an embodiment of the invention that is tuned to receive a signal at 40 MHz. The receiver has source impedance Rs=75 ohms, voltage gain of the LNA Gv=10 (20 dB), value of the inductance of the selective filter L=110 nH, quality factor of the selective filter Q=15, and input power Pin=−5 dBm.

The available/composite voltage gain of the LNA is "Gav" and is shown with reference 1502 in FIG. 15. The matching impact (S11 (dB)) is shown with reference 1504, where a value of zero represents no matching, and a large negative value represents good matching. The impedance of the filter (Zfilter) is shown with reference 1506 in FIG. 15.

The Role of the Buffer

Figure 16:
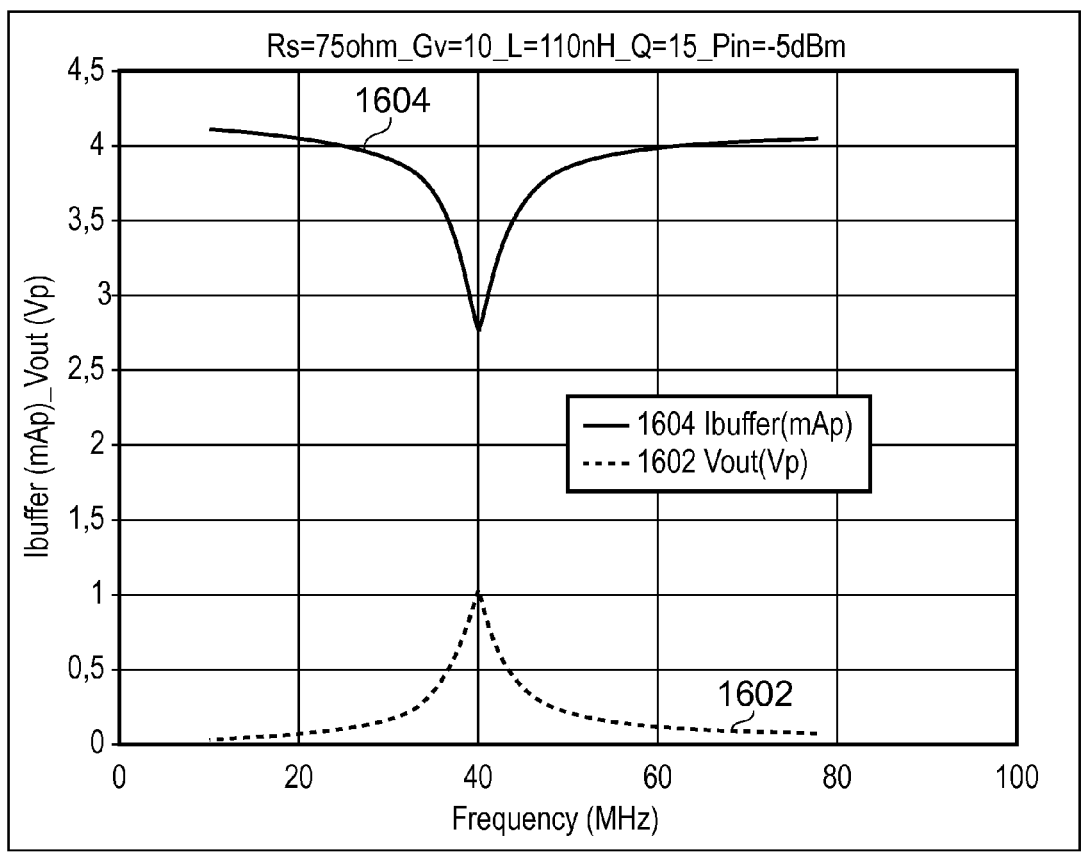
FIG. 16 illustrates graphically the output current versus output voltage of a buffer that can be used with an embodiment of the invention.

FIG. 16 illustrates graphically the performance of the same embodiment that is illustrated with reference to FIG. 15. FIG. 16 shows the output voltage (Vout) with reference 1602 and the current consumption of the buffer (Ibuffer) with reference 1604. The current consumption 1604 is determined by the input power of a far-away interference signal, and has a maximum value of about 4.1 mA in FIG. 16.

Figure 17:
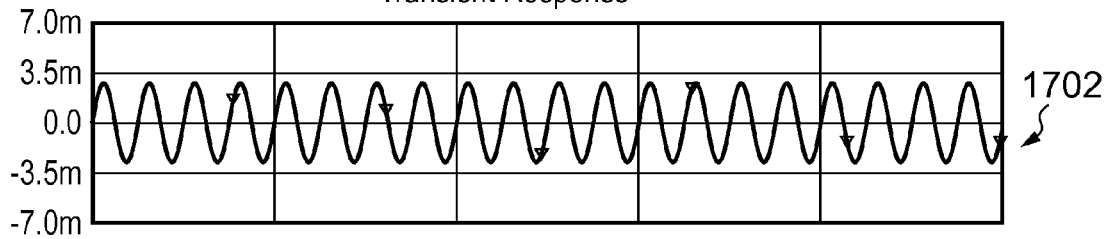
FIG. 17 illustrates graphically the transient current and voltage, both with and without large interference signals, of a buffer that can be used with an embodiment of the invention.
Figure 17:
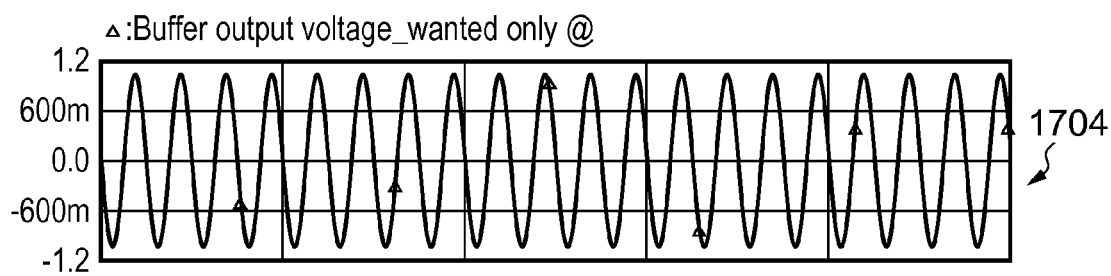
Figure 17:
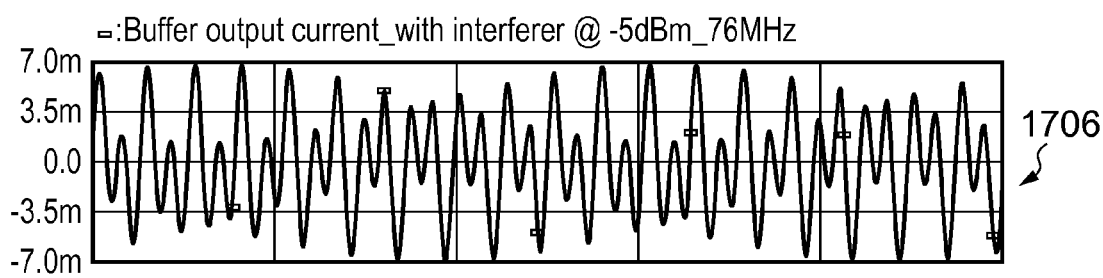
Figure 17:
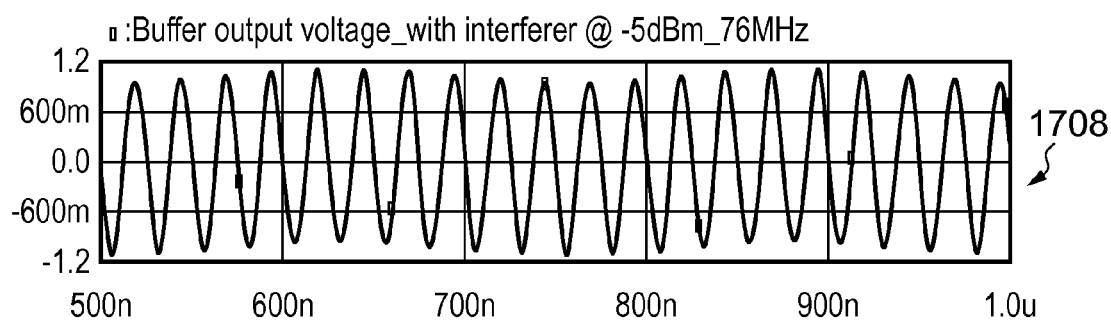

FIG. 17 illustrates a transient simulation of the output current of the same embodiment that is illustrated with reference to FIG. 15. The wanted frequency is 40 MHz, and the interference frequency is 76 MHz (N+6). The wanted and interference input powers are set to −5 dBm.

FIG. 17 shows two graphs 1702 and 1704 that illustrate the buffer output current and voltage when the receiver receives the wanted signal without interference, and two graphs 1706 and 1708 that illustrate the buffer output current and voltage when the receiver receives the wanted signal along with interference.

It can be seen from graphs 1704 and 1708 that the output voltage of the buffer has only a small increase when the interference signal is present. Similarly, the output buffer current is 2.7 mAp with no interference (graph 1702), and has a maximum value of 6.8 mAp with interference (graph 1708). Therefore, it will be appreciated that the necessary construction of the buffer, and the output current and voltage, does not vary significantly in the presence of interference.

If an interference signal is present, then the power required in the buffer 514 increases. In an embodiment of the invention the buffer 514 is a class AB buffer. The power in the class AB buffer will adapt to the presence or absence of an interference signal, thereby acting as a power on demand buffer. An example or realization of such a class AB buffer is depicted as FIG. 18.

Figure 18:
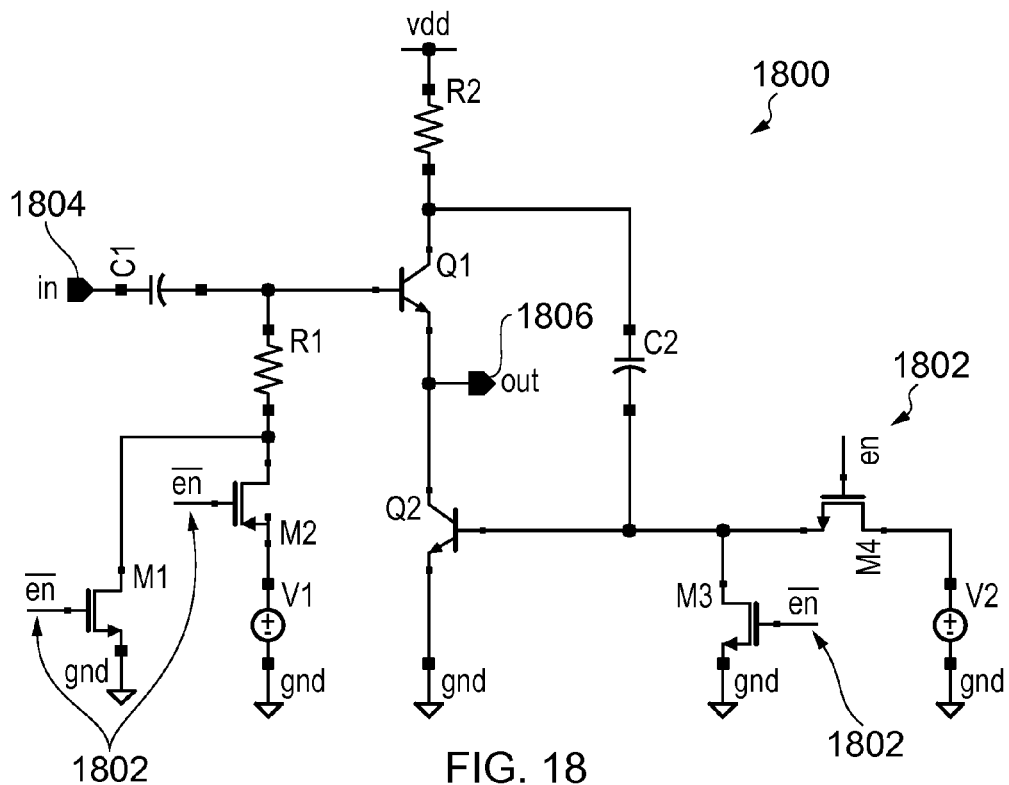
FIG. 18 illustrates schematically a buffer that can be used with embodiments of the invention.

The buffer 1800 of FIG. 18 is a unity voltage gain buffer with an "enable" input 1802 that can be used in a selective LNA according to an embodiment of the invention in order to enable or disable the buffer 1800. Such an example is illustrated as FIG. 20 and is described below. This unity voltage gain buffer 1800 consists of a super emitter follower composed of transistors Q1 and Q2. The buffer 1800 can also adapt the impedance between the LNA output and the selective filter so that the voltage gain of the LNA is not impacted by the impedance of the selective filter, as described in more detail below.

The biasing of the super emitter follower is controlled by fixing the DC collector current of Q1 and Q2 by voltage source V2. The base voltage of Q1 is fixed by voltage source V1.

Small Signal Behaviour of the Buffer of FIG. 18

When a voltage is applied to the input 1804 at the base of Q1, it is converted into a collector current by Q1. This current is flowing into C2 and is amplified by Q2. The output current 1806 of the buffer 1800 is composed of the collector current of Q2, and of the emitter current of Q1 which is about β times smaller than the collector current of Q2 (β is the current gain of Q2). As the collector current of Q1 is small compared to a classical emitter follower, the base-emitter voltage of Q1 is also small, leading to a highly linear unity voltage gain buffer.

Large Signal Behaviour of the Buffer of FIG. 18

The C2 feedback loop allows class AB operation with this buffer 1800. In effect, when a large negative alternance is present at the buffer input "in", then a positive alternance is present on the base of Q2. This positive alternance can have a voltage level, leading to an output current 1806 of the buffer that is higher than the DC current of the buffer 1800. Now when a large positive alternance is present at the buffer input "in" 1804, Q2 is turned OFF. The collector voltage of Q1 has a negative alternance increasing the current flowing into R2. Finally the output current 1806 of the buffer 1800 is higher than the DC current of the buffer 1800 for both positive and negative alternance of the input voltage. This is true while the base-collector voltage of Q1 stays negative. If not, Q1 enters saturation and the output signal 1806 of the buffer is no more linear.

Enable Command for the Buffer of FIG. 18

A control voltage signal "en" 1802 is used to switch ON or OFF the buffer of FIG. 18. This control voltage is connected to the gate of M4 and the inverse control voltage/en is connected to the gate of M1, M2, M3. When the control voltage 1802 is "1" the base of Q1 and the base of Q2 are shunted to the ground so that no current is flowing into the buffer 1800. In this case the output impedance of the buffer is high and the buffer 1800 is switched off.

One or more embodiments disclosed below can benefit from the option of being able to switch off the buffer.

Centre Frequency Tunability

Embodiments of the present invention are intended to be used in applications with a broadband input spectrum, for example in silicon tuners for TV reception of signals having a frequency from 40 MHz up to 1 GHz. To cover such a large frequency range it can be advantageous to have different bands for the selective filter. In effect with an integrated capacitor bank it may not be possible to maintain a good quality factor for a selective filter having a fixed inductance over a wide frequency range.

Figure 19:
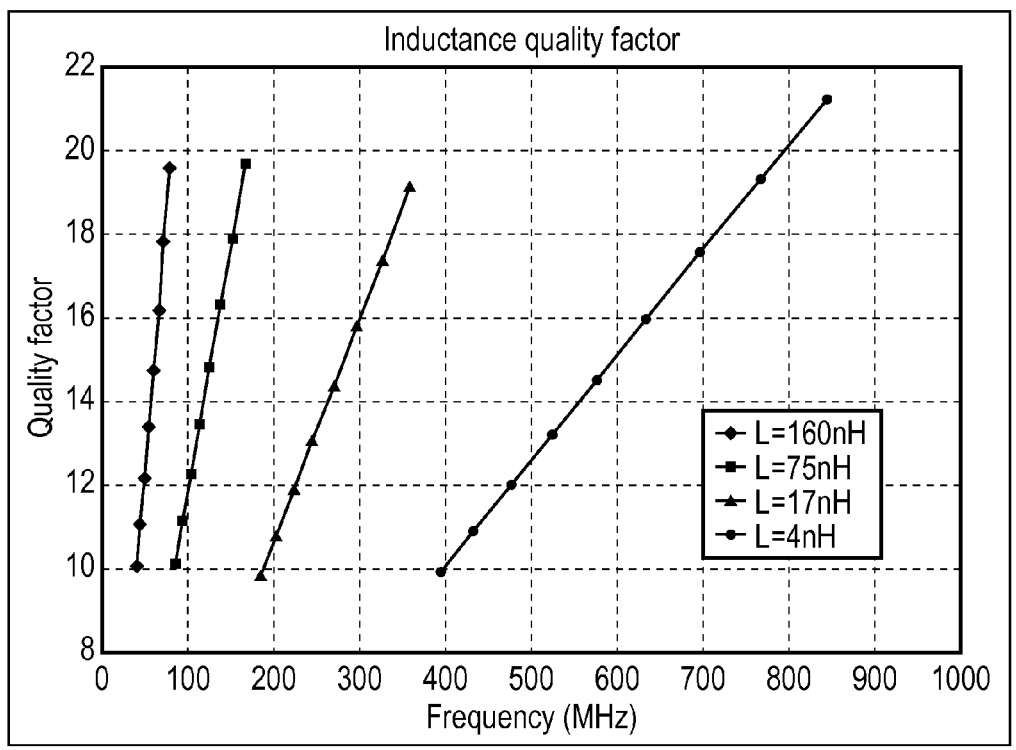
FIG. 19 illustrates graphically how quality factor changes with frequency for tuneable filters having different inductance values.

FIG. 19 shows how the quality factor changes with frequency for selective/tuneable filters having different inductance values. It can be seen that for each inductance value there is a limited range of frequencies that can be used whilst maintaining an acceptable quality factor, and that several inductors are necessary to cover the whole TV band with a good quality factor.

According to an embodiment of the invention, multiple selective feedback paths can be provided between the output of the amplifier and the input of the amplifier such that components can be included in, or excluded from, the feedback path in order to best suit a frequency of wanted signals that are to be received.

Figure 20:
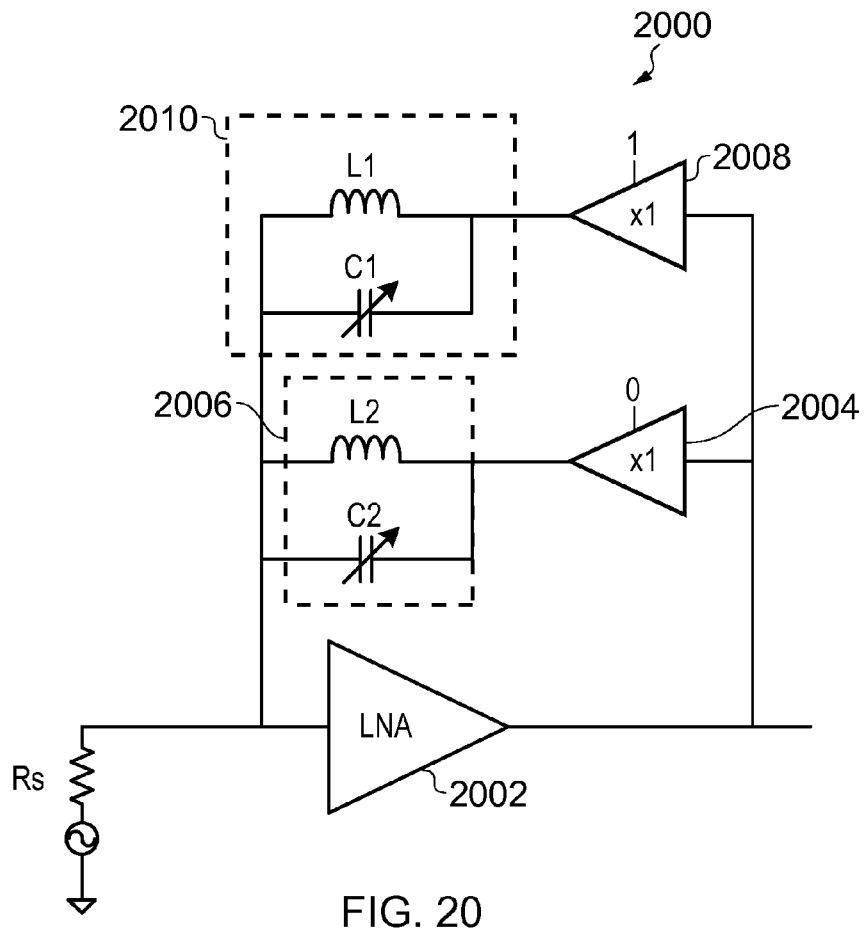
FIG. 20 illustrates a receiver according to an embodiment of the invention.

A receiver 2000 according to a further embodiment of the invention is shown as FIG. 20. The receiver 2000 provides an implementation for using switchable inductances in order to be able to provide a good quality factor over a range of signal frequencies.

The receiver 2000 has an LNA 2002, a first feedback path including a unity gain buffer 2004 and a tuneable filter 2006 in series, and a second feedback path including a unity gain buffer 2008 and a tuneable filter 2010 in series. Each unity gain buffer 2004, 2008 can be switched on or off in order to selectively include or exclude the associated tuneable filter 2006, 2010 in the feedback path, and may be referred to as controllable buffers. The buffers 2004, 2008 can be switched on and off using an enable signal as described above in relation to FIG. 18. In this example, only one buffer 2004, 2008 is switched on at a time, corresponding to the inductance for the desired band as shown in FIG. 19 for example.

The capacitors in the tuneable filters 2006, 2010 of FIG. 20 are programmable/tuneable in order to tune the receiver 2000 to a desired centre frequency. The centre frequency of the in use filter 2006, 2010 is located at or near the frequency of the wanted channel.

Figure 21:
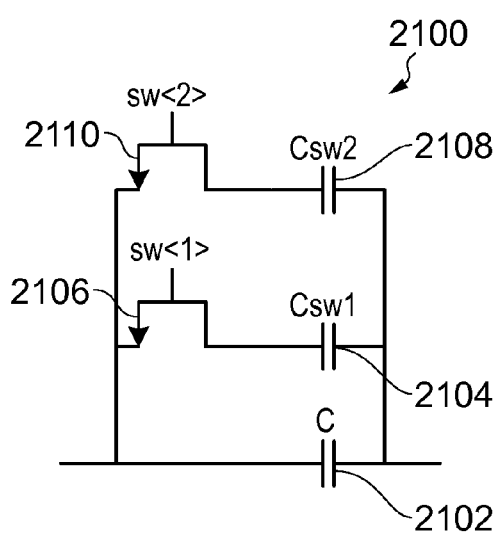
FIG. 21 illustrates a programmable capacitor bank that can be used with embodiments of the invention.

FIG. 21 illustrates a programmable capacitor bank with MOS switches 2100 that is one example implementation of a variable capacitor that can be used with embodiments of the invention.

The circuit of FIG. 21 includes a first capacitor 2102. In parallel with the first capacitor 2102 is a second capacitor 2104 and a MOS switch 2106. Also in parallel with the first capacitor 2102 is a third capacitor 2108 and a MOS switch 2110. The MOS switches 2106, 2110 are operable to selectively include or exclude the associated capacitors 2104, 2108 in parallel with the first capacitor 2102 thereby adjusting the overall capacitance of the circuit of FIG. 21. A required granularity and calibration range can define the size and the number of switches/additional capacitors that are required.

The MOS switches 2106, 2110 can be connected to the input of an LNA to limit the voltage swing on the switches. This connection can limit linearity degradation due to the switches. On the other hand, the connection of the switches to the LNA input can increase the parasitic capacitance on this node, which can degrade the input matching, the NF, and the gain at high frequencies.

MOS switches that are off can also increase the distortion due to parasitic junction capacitances between drain and bulk, and between source and bulk. The junction capacitance is a non linear function of the drain/bulk voltage:

$$Cj = \frac{C_0}{\left(1 - \frac{V_{bg}}{\phi}\right)^n}$$

Where $C_0$, $\phi$ and n are technology dependent (n=0.2 . . . 0.5).

Figure 22:
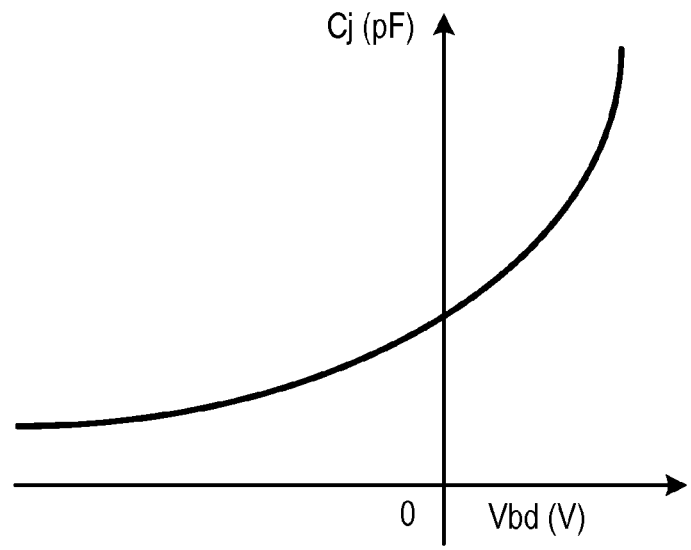
FIG. 22 illustrates graphically the distortion of parasitic junction capacitances in MOS switches.

As depicted in FIG. 22, the distortion of parasitic junction capacitances in the MOS switches can be reduced by reverse biasing the bulk/drain diode.

If the MOS switches 2106, 2110 of FIG. 21 are made smaller to reduce parasitic capacitance then the ON resistance of the switches will increase, thereby leading to a decrease of the quality factor of the filter and additional distortion.

Figure 23:
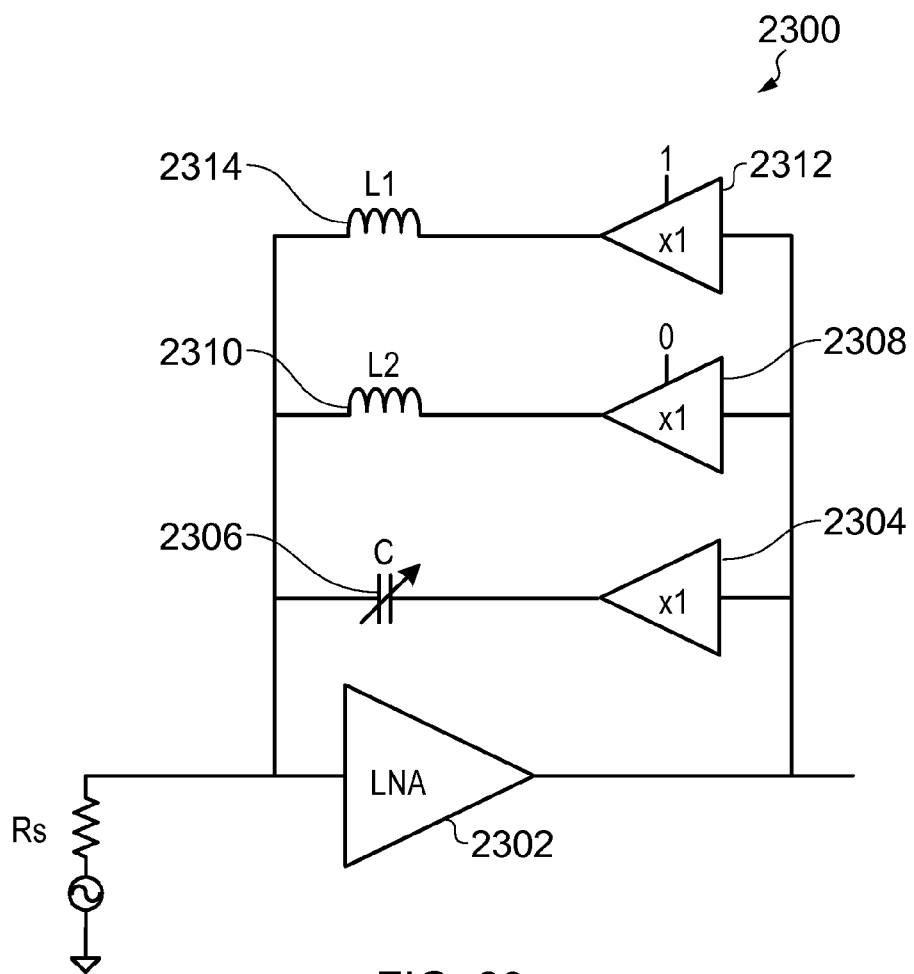
FIG. 23 illustrates a receiver according to an alternative embodiment of the present invention.

FIG. 23 illustrates a receiver 2300 according to an alternative embodiment of the present invention. The receiver 2300 includes an LNA 2302 with three parallel branches in its feedback path. The first branch of the feedback path has a unity gain buffer 2304 and a variable capacitor 2306 in series. In this example, the buffer 2304 is always on so that the variable capacitor 2306 is always included in the feedback path of the LNA 2302.

The second branch of the feedback path includes a unity gain buffer 2308 and a first inductor 2310 in series. The unity gain buffer 2308 in the second branch can be switched on or off to effectively include or exclude the first inductor 2310 as part of a tuneable filter along with the capacitor 2306. The third branch of the feedback path includes a unity gain buffer 2312 and a second inductor 2314 in series. The unity gain buffer 2312 in the third branch can also be switched on and off in the same way as the unity gain buffer 2308 in the second branch.

In some embodiments, only one of the unity gain buffers 2308, 2312 in the second and third branches can be switched on at any one time. The second inductor 2314 can have a different inductance value to the first inductor 2310 so that different branches of the feedback path can be used in accordance with a desired frequency that is to be received.

The example of FIG. 23 can be advantageous as the parasitic capacitance at the antenna side of the receiver can be reduced as only one capacitor bank is driven by a dedicated buffer 2304. In this case the output impedance of the buffer will degrade the quality factor of the LC tank.

Figure 24:
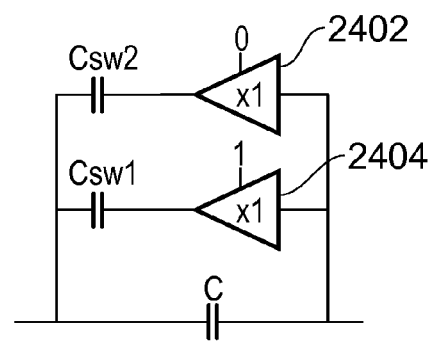
FIG. 24 illustrates a programmable capacitor bank that can be used with embodiments of the invention.

If the parasitic capacitance of the MOS switches at the antenna node is still a problem with the implementation of FIG. 23, then the MOS switches could be replaced entirely or partially by buffers, and such an example is depicted as FIG. 24. This may be at the cost of additional power consumption.

FIG. 24 illustrates a programmable capacitor bank that is one example implementation of a variable capacitor that can be used with embodiments of the invention. FIG. 24 illustrates a circuit that is similar to that of FIG. 21, except that the MOS switches of FIG. 21 have been replaced with controllable unity gain buffers 2402, 2404.

Centre Frequency Calibration

Figure 25:
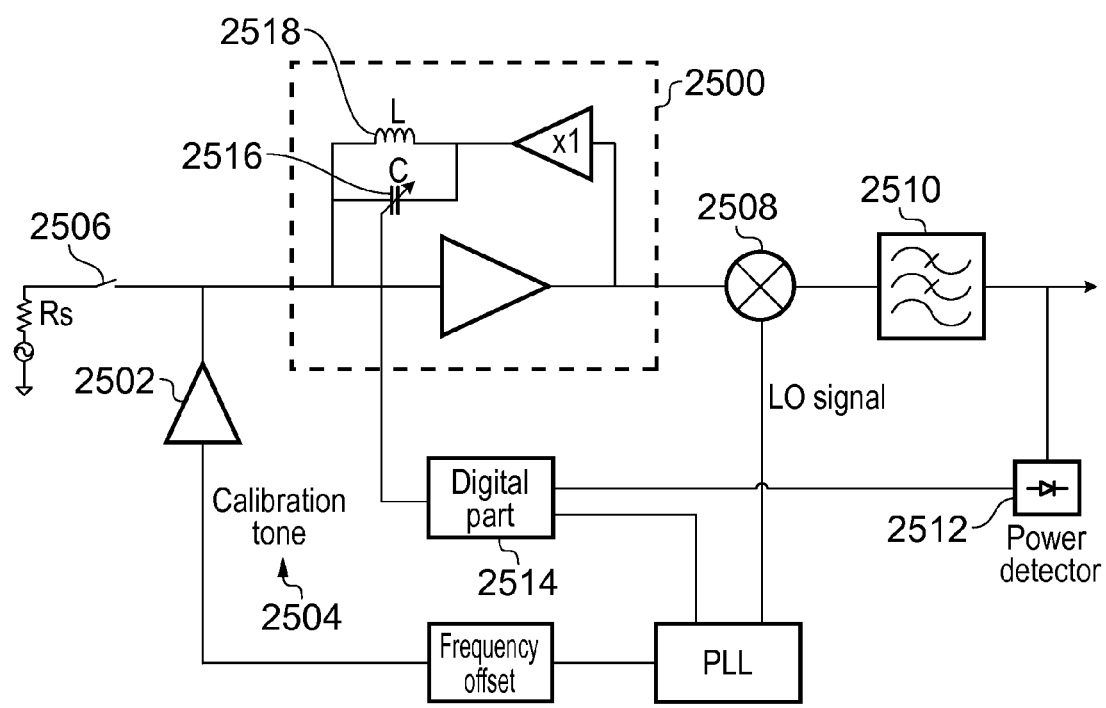
FIG. 25 illustrates schematically a receiver according to another embodiment of the invention.

FIG. 25 illustrates schematically a receiver 2500 according to another embodiment of the invention. A calibration of the centre frequency of the receiver 2500 can be performed by injecting a calibration tone 2504 to the input of the receiver 2500 as depicted in FIG. 25.

An amplifier 2502 is used to inject the calibration tone 2504 tone, and should have an output impedance close to 75 ohms to match with the input of the receiver 2500. It may be necessary to add a series switch 2506 between the antenna and the receiver 2500 to avoid emission of the calibration signal. This series switch 2506 may be necessary in cable applications where it can be forbidden to inject a signal on the cable. Also the power of the calibration tone signal 2504 should be sufficiently low to avoid perturbations on the cable.

The calibration tone 2504 is injected at the input to the receiver 2500. The output signal of the receiver 2500 is down converted by a mixer 2508 with the proper local oscillator (LO) signal. The output intermediate frequency (IF) signal of the mixer is low pass filtered by filter 2510. A power detector 2512 senses the output signal of the low filter 2510 and a digital state machine 2514 is used to adjust the value of the capacitor 2516 in the feedback path of the receiver 2500 until the centre frequency of the selective filter that is provided by the capacitor 2516 and inductor 2518 is as close as possible to the calibration tone.

Gain Variation

Changing the value of the capacitor of the selective filter in the feedback path of the amplifier may change the composite voltage gain of the receiver. In some embodiments it may be desirable to keep the composite voltage gain constant, in which case the intrinsic voltage gain of the LNA can be changed to a certain extent. Such a variation in the intrinsic voltage gain of the LNA may be at the cost of a decreased quality factor.

Figure 26:
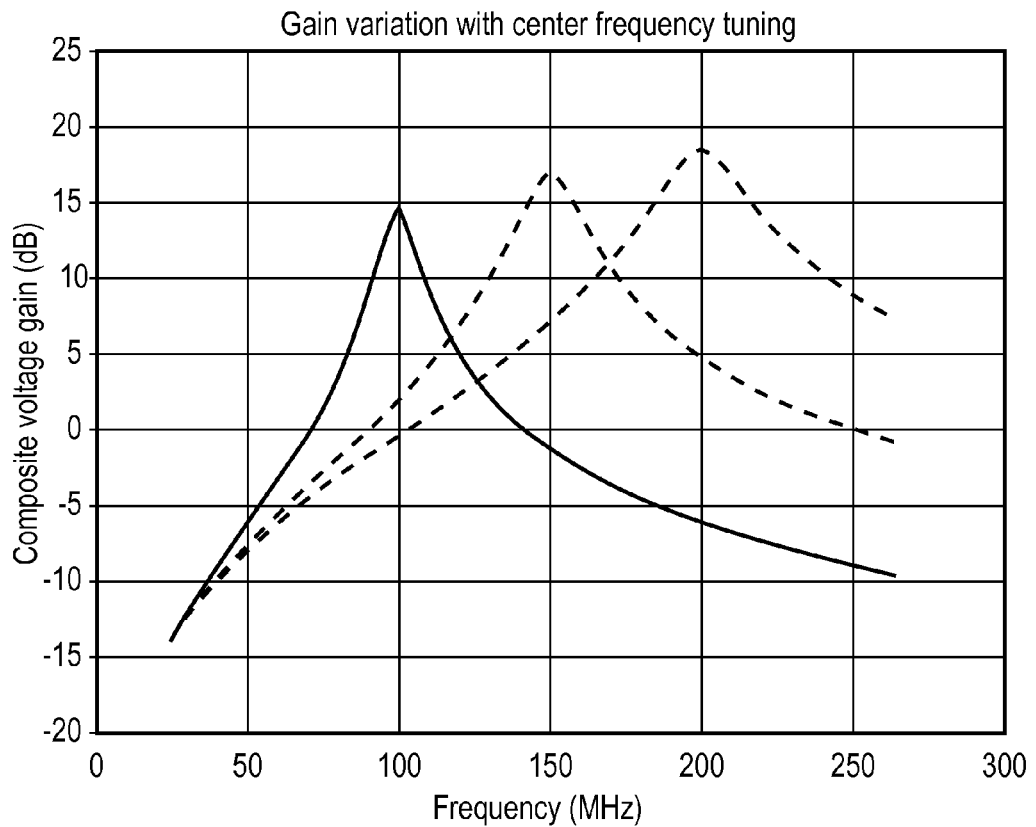
FIG. 26 illustrates graphically how the composite voltage gain of a receiver according to an embodiment of the invention can vary.

FIG. 26 shows graphically how the composite voltage gain of a receiver according to an embodiment of the invention can vary when the centre frequency is tuned to different values.

Figure 27:
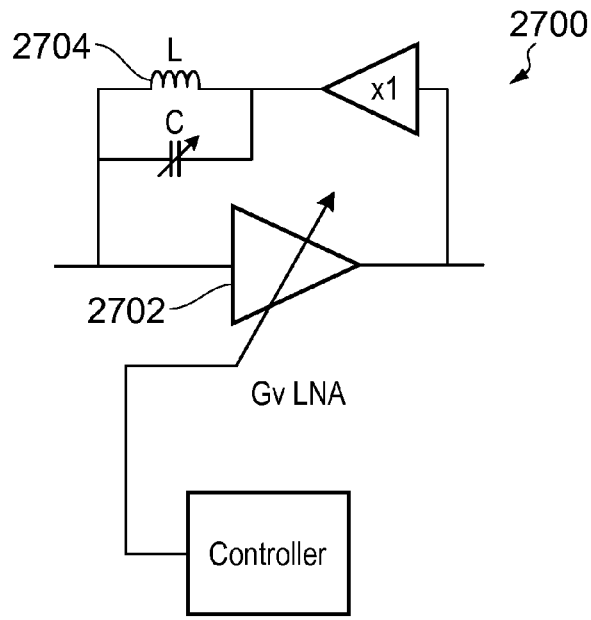
FIG. 27 illustrates a receiver according to an embodiment of the invention.

FIG. 27 illustrates a receiver 2700 according to an embodiment of the invention whereby the intrinsic voltage gain of the LNA 2702 can be changed in accordance with the value of the variable capacitor 2704 of the selective filter such that the composite voltage gain of the selective LNA is kept substantially constant.

FIG. 27 illustrates a controller 2706 that can provide an output signal for controlling the intrinsic voltage gain of the LNA 2702. The controller 2706 may have access to a look up table (LUT) or database to determine which values should be applied for the intrinsic voltage gain of the LNA 2702 in accordance with the frequency to which the receiver is tuned.

Figure 28:
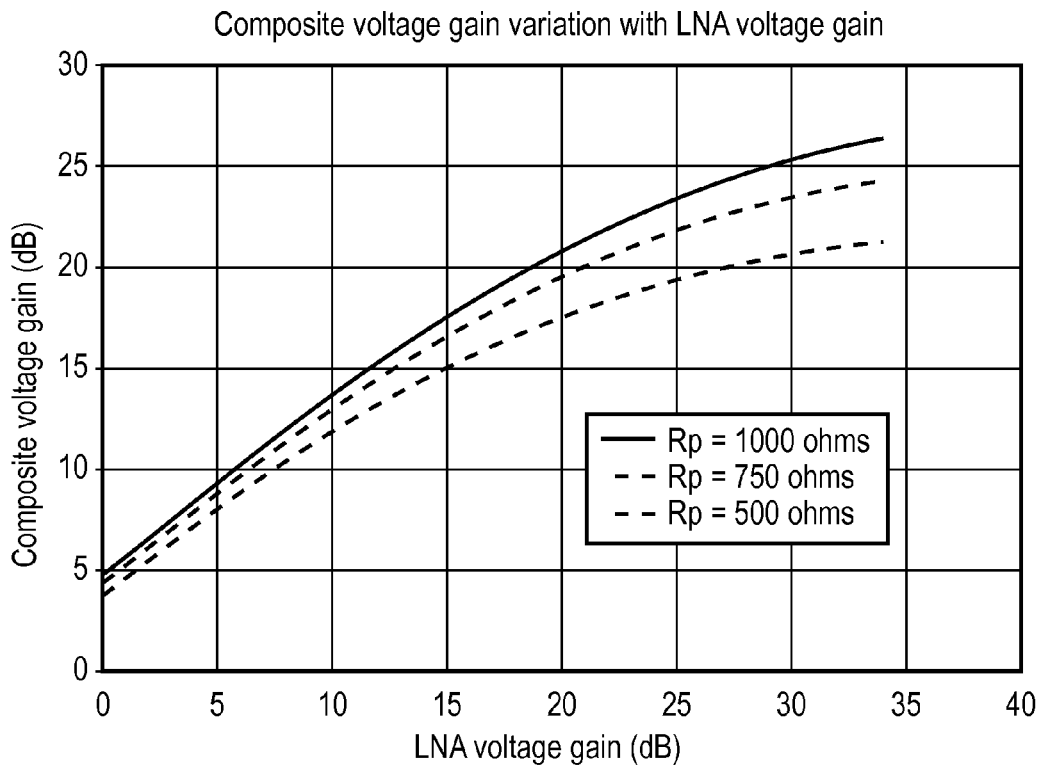
FIG. 28 illustrates graphically how the composite voltage gain of a filter can be compensated by a variation of the LNA voltage gain.

FIG. 28 illustrates graphically how the composite voltage gain of the selective filter can be compensated by a variation of the LNA voltage gain to a certain extent. Rs=75 ohms in this example. For low values of Rp, the composite voltage gain cannot be overtaken even with higher LNA voltage gain.

If a receiver according to an embodiment of the present invention must have variable gain then the voltage gain of the LNA can be changed. As this can degrade the quality factor, a switchable matching network can be incorporated into the feedback path of the LNA. This matching network can be an integrated switched capacitor bank.

Figure 29:
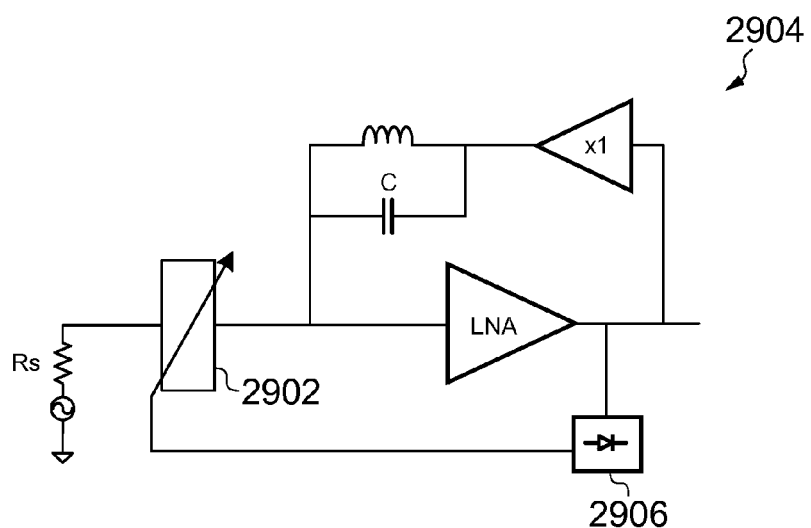
FIG. 29 illustrates a receiver according to an embodiment of the invention.
Figure 30A:
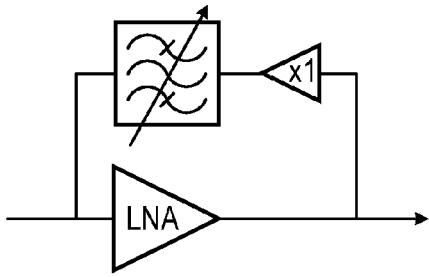
Figure 30B:
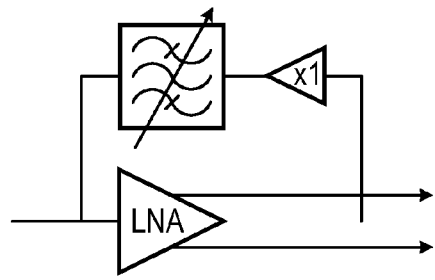
Figure 30C:
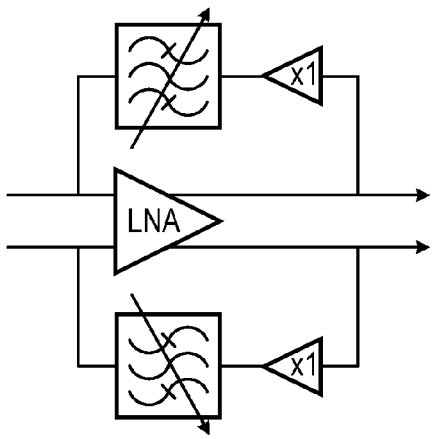

In some examples, it can become difficult to make the receiver stable for the whole gain settings by switching the voltage gain of the LNA. In this case, the gain variation can be performed with a resistive attenuator in front of the receiver. FIG. 29 illustrates schematically such a resistive attenuator 2902 at the input to the receiver 2904. As the attenuator 2902 is made of resistances, then the input matching is more and more broadband as the series resistor is increased. The receiver 2904 includes a detector 2906 that can sense the LNA output signal and then adjust the value of the resistive attenuator 2902 so that the output signal amplitude does not exceed a take over point (TOP) but is substantially similar to the TOP in order to protect the LNA against clipping. In this way, significant distortion at the output of the amplifier can be reduced or avoided. FIGS. 30a to 30d illustrate schematically receivers according to embodiments of the invention. FIG. 30a illustrates an LNA with a single input to a single output. FIG. 30b illustrates an LNA with a single input to differential outputs. FIG. 30c illustrates an LNA with differential inputs to differential outputs.

Figure 30D:
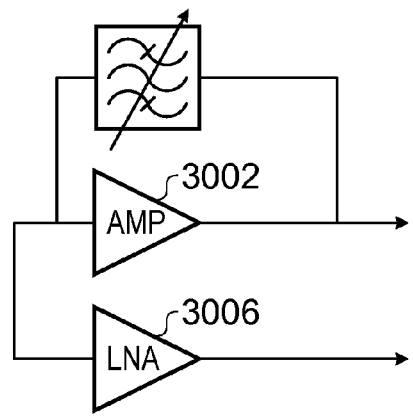

FIG. 30d is slightly different as the "amplifier" that is disclosed herein as having a tuneable filter in its feedback path is not the LNA. FIG. 30d illustrates an embodiment of the invention having an LNA 3006 that receives an input signal from an antenna (not shown) and provides the output signal. Also connected to the input of the LNA 3006 is an amplifier 3002. The output of the amplifier 3002 is connected to its input using a feedback path comprising a tuneable filter 3004. The feedback path can also include any of the features disclosed in other embodiments of the invention.

The example of FIG. 30d provides the same advantages as the other embodiments of the invention as the Miller effect of the tuneable filter serves to filter out the interference signals before they are processed by the LNA 3006.

In some examples, the presence of a filter in the feedback of the LNA may create instability. An example of a receiver according to an embodiment of the invention whereby the stability is improved is provided as FIG. 31. The receiver is a single input to a differential output configuration.

FIG. 31 shows the components of the LNA within box 3102, the components of the buffer in box 3104 and the components of the tuneable filter in the box 3106.

In the implementation of FIG. 31 the LNA 3102 is a basic differential pair. The feedback loop contains only two active stages, and only one gain stage. The loop gain is defined by the differential pair and is about 20 dB in DC. In this configuration the stability is ensured even if the LC tank is tuned as can be seen from the graphical results of FIGS. 32A and B and 33.

FIGS. 32A and B illustrates the gain and S11 versus LC tank center frequency for the implementation of FIG. 31.

FIG. 33 illustrates the loop gain and phase for the implementation of FIG. 31, showing that this implementation is stable with more than 85° phase margin.

Embodiments of the invention can be used in, or with, silicon tuners for television reception, for example in LCD televisions. Embodiments can be used in any receiver where it is advantageous to improve immunity to strong interference signals without impacting other performances like noise figure, such as: GPS, terrestrial television and cellular, Wifi, Bluetooth, cordless, and satellite communications, as non-limiting examples.

Embodiments of the invention can include one or more of the following:
  A tracking filter, which may be a narrowband tracking filter;
  A Broadband low noise amplifier (LNA);
  A selective filter;
  A selective filter connected between the input and the output of an LNA;
  A centre frequency of a selective filter that is programmable to track the frequency of a wanted channel;
  The interference signals are filtered at an LNA input;
  LNA input and output can be single or differential; and
  If the gain of an LNA is variable, the core amplifier gain can be changed. If this causes a stability issue then the gain of the LNA can be varied by connecting an attenuator in front of the LNA.

An embodiment of the invention can include an LNA, a feedback amplifier, and a selective filter. The LNA and the feedback amplifier can be broadband and have a high input impedance. The selective filter can be an LC tank circuit, and the feedback amplifier can be a unity voltage gain buffer.

Immunity to close-in-channel interference signals can be of great importance in TV tuners for terrestrial reception. Also immunity to strong out of band interference signals can be important due to new LTE standard for mobile communications. A low noise amplifier/receiver according to embodiments of the present invention can have selectivity to filter out interference signals. The receiver of an embodiment of the present invention is made of a core amplifier and of a band pass filter. The band pass filter is connected between the input and the output of the core amplifier. Due to the Miller effect, this filtering network is input-referred and acts as if it was connected directly to the antenna. This configuration can be very effective to filter out interference signals directly at the antenna. As the band pass filter is tunable, the centre frequency is adaptive to the wanted channel. Embodiments disclosed herein can improve immunity against LTE interference signals. It can also be a key feature to enable CAN tuners to be replaced by silicon tuners in future televisions.

The invention claimed is:

1. A receiver comprising:
   a variable gain amplifier having an input and an output, wherein the input of the variable gain amplifier is configured to receive a signal; and
   a feedback path between the output and the input of the variable gain amplifier, wherein the feedback path includes a filter and a buffer amplifier in series, wherein an input of the buffer amplifier is connected to an output of the variable gain amplifier, an output of the buffer amplifier is connected to an input of the filter, an output of the filter is connected to the input of the variable gain amplifier, and wherein the filter is configured to pass signals having a desired frequency;
   and a detector configured to detect the output of the amplifier and control the gain of the variable gain amplifier in accordance with the output of the variable gain amplifier in order to avoid distortion of the output.

2. The receiver of claim 1, wherein the variable gain amplifier is a low noise amplifier.

3. The receiver of claim 1, wherein the filter is a tuneable filter.

4. The receiver of claim 1, wherein the filter is a band pass filter.

5. The receiver of claim 1, further comprising a controller configured to adjust a gain of the variable gain amplifier in order to change an input impedance of the receiver such that it is brought into conformity with an impedance of an antenna to which the receiver is connected in use.

6. The receiver of claim 1, wherein the feedback path includes a variable resistor, and the receiver also includes a controller configured to adjust a value of the variable resistor in order to change an input impedance of the receiver such that it is brought into conformity with an impedance of an antenna to which the receiver is connected in use.

7. The receiver of claim 1, further comprising a plurality of feedback paths in parallel between the output and the input of the variable gain amplifier, wherein at least one of the feedback paths is configured to be included or excluded from the receiver in accordance with the frequency of the desired signals.

8. The receiver of claim 7, wherein at least one of the feedback paths comprises a controllable buffer, and wherein gains of the controllable buffers are configured to be set to zero in order to exclude the components in the associated feedback path.

9. The receiver of claim 7, wherein the plurality of feedback paths comprise filters that are configured to pass signals of different frequencies.

10. The receiver of claim 7, further comprising a first, a second and a third feedback path in parallel with each other, wherein the first feedback path comprises a buffer amplifier and a variable capacitor, the second feedback path comprises a controllable buffer and a first inductor, and the third feedback path comprises a controllable buffer and a second inductor.

11. The receiver of claim 1, further comprising a variable resistive attenuator connected to the input of the variable gain amplifier, and a detector, wherein the detector is configured to sense the output signal of the variable gain amplifier and adjust the value of the resistive attenuator so that the output signal amplitude does not exceed a take over point but is substantially similar to the take over point in order to protect the variable gain amplifier against clipping.

12. The receiver of claim 1, wherein the input of the variable gain amplifier) is connected to an input of a low noise amplifier.

13. The receiver of claim 1, wherein the buffer amplifier is a unity gain amplifier.

* * * * *